(12) United States Patent
Naber et al.

(10) Patent No.: US 12,199,414 B1
(45) Date of Patent: Jan. 14, 2025

(54) AUTOMATIC BOND ON TO ENERGIZED POWER LINE FOR REMOTE OPERATIONS

(71) Applicant: Altec Industries, Inc., Birmingham, AL (US)

(72) Inventors: William Naber, Saint Joseph, MO (US); Robert Nichols, Saint Joseph, MO (US); Timothy J. Mourlam, Shawnee, KS (US)

(73) Assignee: Altech Industries, Inc., Birmingham, AL (US)

( * ) Notice: Subject to any disclaimer, the term of this patent is extended or adjusted under 35 U.S.C. 154(b) by 0 days.

(21) Appl. No.: 18/396,009

(22) Filed: Dec. 26, 2023

(51) Int. Cl.
*H02G 1/02* (2006.01)
*G01R 31/52* (2020.01)
*H02G 1/12* (2006.01)
*H02G 1/16* (2006.01)

(52) U.S. Cl.
CPC .................. *H02G 1/02* (2013.01); *H02G 1/12* (2013.01); *H02G 1/16* (2013.01); *G01R 31/52* (2020.01)

(58) Field of Classification Search
CPC ... H02G 1/02; H02G 1/12; H02G 1/16; G01R 31/52
See application file for complete search history.

(56) References Cited

U.S. PATENT DOCUMENTS

| 6,507,163 | B1 * | 1/2003 | Allen | B25J 9/1689 |
| | | | | 318/560 |
| 10,658,822 | B2 * | 5/2020 | Devine | B66C 23/66 |
| 11,660,750 | B1 | 5/2023 | Sykes et al. | |
| 11,717,969 | B1 | 8/2023 | Mourlam et al. | |
| 11,742,108 | B1 * | 8/2023 | Naber | H01B 7/02 |
| | | | | 174/110 R |
| 11,749,978 | B1 * | 9/2023 | Lindquist | H02G 1/02 |
| | | | | 294/174 |
| 11,794,359 | B1 | 10/2023 | Sykes et al. | |
| 2001/0055525 | A1 | 12/2001 | Inokuchi et al. | |
| 2008/0312769 | A1 | 12/2008 | Sato et al. | |
| 2015/0097348 | A1 | 4/2015 | Steinfels et al. | |
| 2019/0302810 | A1 | 10/2019 | Kibler et al. | |
| 2023/0123463 | A1 | 4/2023 | Lin et al. | |

OTHER PUBLICATIONS

U.S. Appl. No. 18/395,944 Final Office Action issued Jul. 25, 2024.
U.S. Appl. No. 18/395,944 Non-Final Office Action issued Mar. 20, 2024.

* cited by examiner

*Primary Examiner* — Seahee Hong
(74) *Attorney, Agent, or Firm* — Erise IP, P.A.

(57) ABSTRACT

Automatic bond on techniques for remote operations on energized power lines are disclosed. A remote assembly may comprise a robot unit and a jib. The jib may have an end effector at a distal end, a proximal end coupled to the robot unit, and an insulating section between the distal end and the proximal end. The end effector may couple to the energized power line, and the insulating section may electrically isolate the robot unit from the energized power line. An actuator at the proximal end may be selectively actuatable to electrically connect to the end effector, thereby electrically bonding the robot unit to the energized power lines to enable operations on energized power line components. The jib may toggle the robot unit between the electrically bonded and grounded or floating states to allow the robot unit to operate on both grounded and energized components.

10 Claims, 13 Drawing Sheets

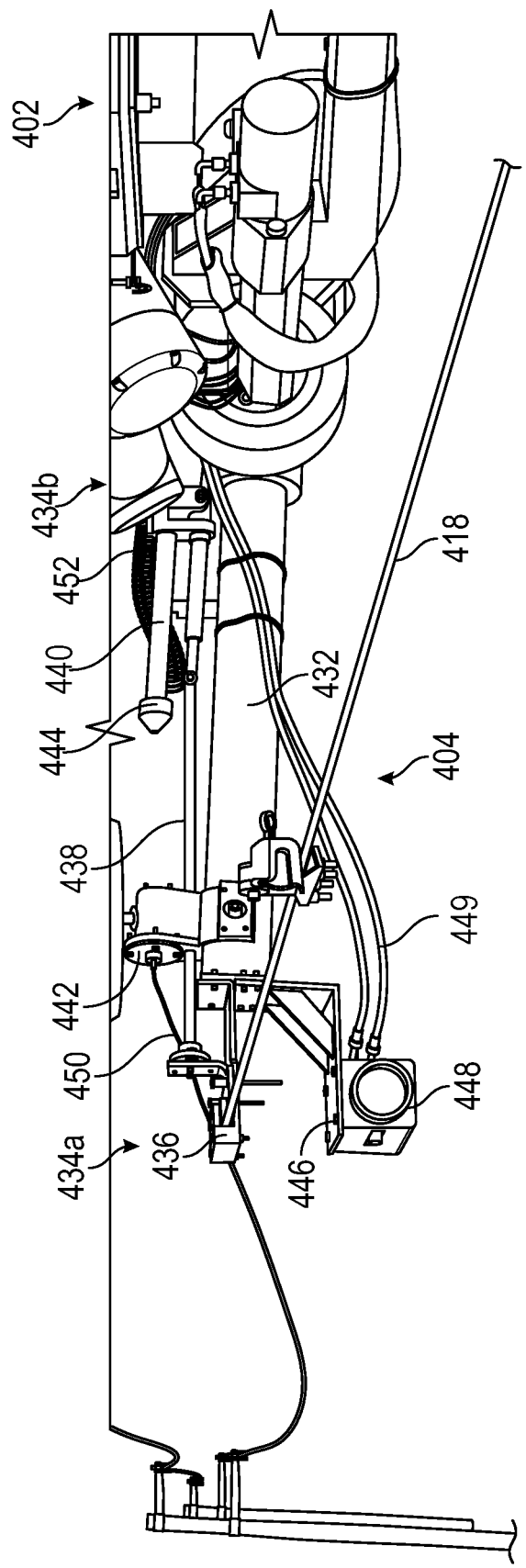

AUTOMATIC BOND ON TO ENERGIZED POWER LINE FOR REMOTE OPERATIONS

BACKGROUND

1. Field

Embodiments of the present teachings relate to remotely operating on energized power lines. More specifically, embodiments of the present teachings relate to automatically bonding on to and off of energized power lines for remote operations on grounded and energized components.

2. Related Art

Utility workers commonly utilize an aerial device to reach remote locations, such as overhead power lines, for installation, repair, and/or maintenance of electric power components. Due to the inherent dangers with operating on energized power lines and at high heights, it is desired to perform power line maintenance in a safer manner by removing the lineman from near the power line to a safe location away from the power line. Power line work on distribution type power lines is particularly dangerous because the distance between energized and grounded components is small enough that a lineman could inadvertently touch both components simultaneously, leading to a ground fault.

Linemen may use rubber goods to electrically insulate an energized phase. For example, rubber blankets are typically placed on an energized phase to protect the lineman and the energized phase from accidental contact with grounded structures. While such rubber goods provide protection when performing high voltage work, the rubber goods are thick and heavy such that the rubber goods become difficult to manage using a robotic system.

While remotely operating on power lines, it is desirable to provide a robot unit with tools that are easy to use. Further, it is advantageous to provide said tools that are formed of conductive materials. Accordingly, what is needed is a remote assembly that can safely operate on energized power lines with electrically non-insulating tools and that does not require the use of rubber goods to provide protection from the energized power lines.

SUMMARY

Embodiments of the disclosure solve the above-mentioned problems by providing systems and methods for automatically electrically bonding to and off of an energized power line using a remote assembly that enables safe operation on energized components of the energized power line. A remote assembly, operable by an operator, may be used to work on an energized power line. The remote assembly may comprise a robot unit having one or more robotic arms for performing operations on the energized power line. A jib may be coupled to the robot unit and configured as a high-capacity manipulator for the remote assembly that is capable of lifting large loads (e.g., at least five hundred pounds). At a distal end, the jib may have an end effector for coupling to an energized phase (e.g., a clamp or a vise), and at a proximal end the jib may be coupled to the robot unit. The jib may further comprise an electrically insulating section located between the proximal end and the distal end that electrically isolates the proximal end and, therefore, the robot unit, from the energized phase when the end effector is connected to the energized phase. An actuator may be located at the proximal end and may be extendable to electrically connect to the distal end to electrically bond the robot unit to the energized phase. Accordingly, when operator 124 wishes to use the robot unit to operate on energized components, operator 124 may actuate the actuator to electrically connect to the distal end. When operator 124 wishes to operate on grounded components of the energized power line, operator 124 may retract the actuator to remove the electrical bond to the energized phase.

In some embodiments, the techniques described herein relate to a system for remotely operating on energized power lines, including: a boom assembly having a boom proximal end and a boom distal end; and a remote assembly coupled to the boom distal end, the remote assembly including: a robot unit for operating on an energized power line; and a jib coupled to the robot unit and configured to electrically bond to a phase of the energized power line, the jib including: a jib distal end; a jib proximal end coupled to the robot unit; an electrically insulating section between the jib distal end and the jib proximal end; an end effector at the jib distal end for coupling to the phase; and an actuator at the jib proximal end for electrically connecting to the end effector to electrically bond the robot unit to the phase.

In some embodiments, the techniques described herein relate to a system, wherein the actuator is movable from the jib proximal end to the jib distal end to electrically connect to the end effector.

In some embodiments, the techniques described herein relate to a system, wherein the actuator includes a tapered end, wherein the jib further includes a tapered receiver for receiving the tapered end of the actuator, wherein the end effector includes a first cable electrically connected to the tapered receiver, and wherein the actuator includes a second cable that electrically connects to the first cable when the tapered end of the actuator is received in the tapered receiver to electrically bond the robot unit to the energized power line.

In some embodiments, the techniques described herein relate to a system, further including: a plurality of tools stored at the remote assembly, wherein a first tool of the plurality of tools is a pin puller tool for decoupling a first end of an insulator from the phase, and wherein the robot unit further includes at least one robotic arm configured to operate the pin puller tool.

In some embodiments, the techniques described herein relate to a system, wherein the robot unit decouples the insulator from the phase while the robot unit is electrically bonded to the energized power line.

In some embodiments, the techniques described herein relate to a system, wherein the at least one robotic arm is further configured to decouple a second end of the insulator from a utility pole of the energized power line while the remote assembly is not electrically bonded to the energized power line.

In some embodiments, the techniques described herein relate to a system, further including: a user interface configured to display a bonding state of the robot unit.

In some embodiments, the techniques described herein relate to a system, wherein the user interface includes at least one affordance actuatable to generate a control signal to the robot unit to perform one of a bond off action or a bond on action.

In some embodiments, the techniques described herein relate to a method for remotely operating on energized power lines, including: approaching an energized power line using a boom assembly, the boom assembly having a remote assembly at a distal end, wherein the remote assembly is configured to operate on the energized power line; electrically bonding to an energized phase of the energized power line with the remote assembly to place the energized power line and the remote assembly at a common electric potential; performing a first operation on an energized component of the energized power line using the remote assembly; automatically removing the electrical bond of the remote assembly to the energized power line to place the remote assembly at earth potential or at floating potential; and performing a second operation on a deenergized component of the energized power line.

In some embodiments, the techniques described herein relate to a method, wherein the remote assembly includes an insulating jib for coupling to the energized power line and a robot unit for performing the first operation and the second operation.

In some embodiments, the techniques described herein relate to a method, wherein the insulating jib includes an actuator for electrically connecting the energized power line to the robot unit to place the robot unit at the common electric potential.

In some embodiments, the techniques described herein relate to a method, further including: automatically maintaining a minimum distance between the robot unit and the energized phase.

In some embodiments, the techniques described herein relate to a method, wherein the energized component is a first connector for an insulator that couples a first end of the insulator to the energized phase, wherein the first operation includes decoupling the first end of the insulator from the first connector, wherein the deenergized component is a second connector for the insulator that couples a second end of the insulator to a utility pole, and wherein the second operation includes decoupling the second end of the insulator from the second connector to remove the insulator from the energized power line.

In some embodiments, the techniques described herein relate to a method, further including: performing a third operation including coupling a new insulator to the utility pole via the second connector while the remote assembly is at earth potential; and performing a fourth operation including coupling the new insulator to the energized phase via the first connector while the remote assembly is at the common electric potential.

In some embodiments, the techniques described herein relate to a remote assembly for remotely operating on a power distribution line, including: a jib, including: a distal end including an end effector actuatable to couple to an energized phase of the power distribution line; a proximal end including an extendable actuator configured to electrically bond to the end effector; and an electrically insulating section between the distal end and the proximal end; a robot unit coupled to the proximal end of the jib, the robot unit including at least one robotic manipulator for operating on the power distribution line; and at least one processor configured to execute computer-executable instructions that, when executed, cause the remote assembly to: responsive to receiving a first instruction, automatically electrically bond the robot unit to the energized phase; and responsive to receiving a second instruction, automatically remove the electrical bond of the robot unit to the energized phase.

In some embodiments, the techniques described herein relate to a remote assembly, wherein the jib further includes: a receiver proximate to the distal end of the jib, the receiver configured to receive the extendable actuator to electrically connect the proximal end to the distal end.

In some embodiments, the techniques described herein relate to a remote assembly, wherein the at least one robotic manipulator is configured to perform a first operation on an energized power line component while the robot unit is electrically bonded to the robot unit and a second operation on a power line component while the robot unit is not electrically bonded to the energized phase.

In some embodiments, the techniques described herein relate to a remote assembly, wherein the end effector remains coupled to the energized phase for both the first operation and the second operation.

In some embodiments, the techniques described herein relate to a remote assembly, wherein the extendable actuator is configured to selectively bond to the end effector to change an electrical bonding state of the robot unit.

In some embodiments, the techniques described herein relate to a remote assembly, further including: a sensor configured to monitor a leakage current of the jib; and wherein the at least one processor is further configured to perform a corrective action responsive to a detection that the leakage current is above a threshold leakage current.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present teachings will be apparent from the following detailed description of the embodiments and the accompanying drawing figures.

BRIEF DESCRIPTION OF THE DRAWING FIGURES

Embodiments of the present teachings are described in detail below with reference to the attached drawing figures, wherein:

FIGS. 5B-5C illustrate a jib of the remote assembly system for some embodiments;

Figure 1:
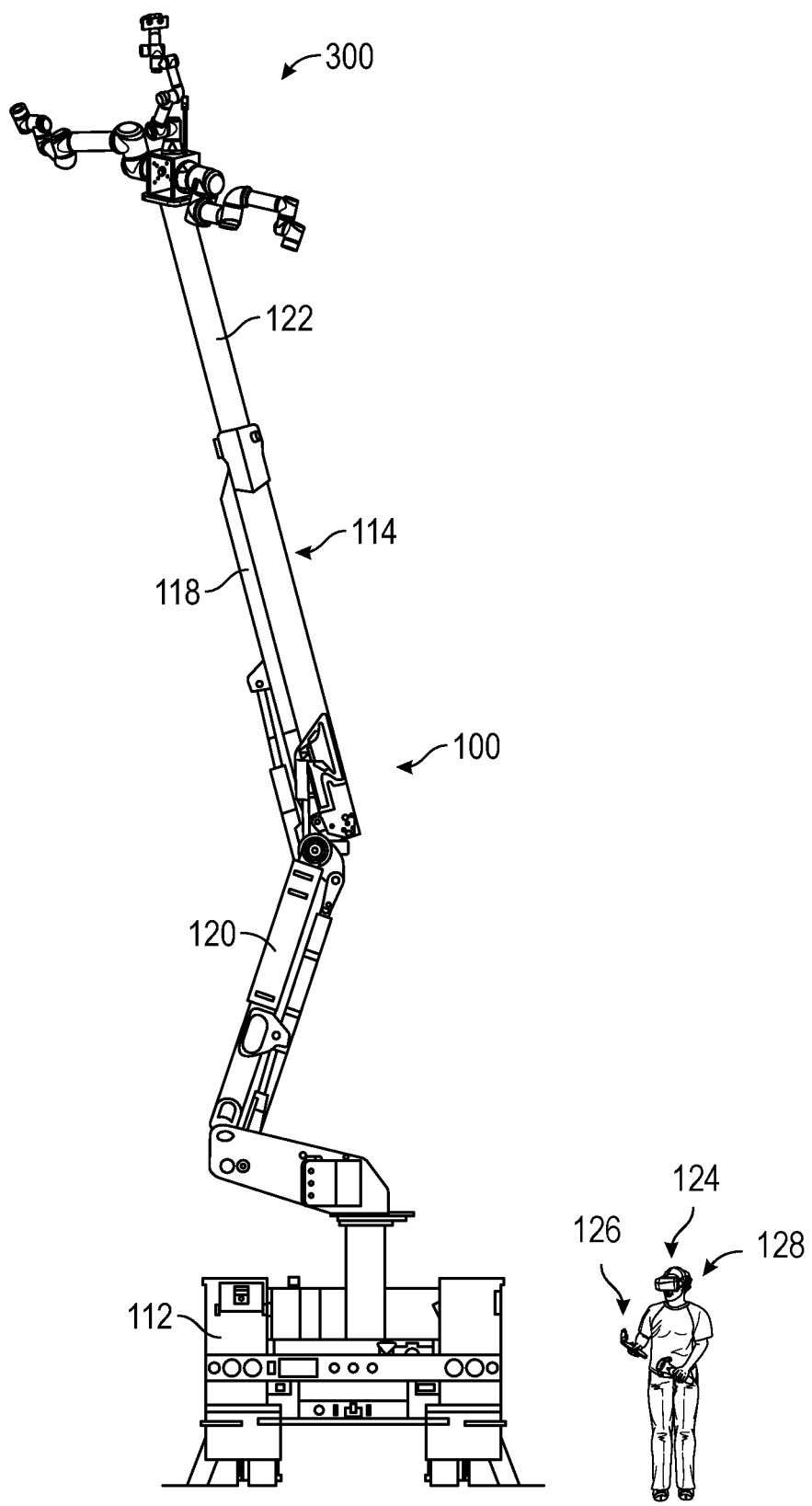
FIG. 1 is an aerial device for some embodiments.

The drawing figures do not limit the present teachings to the specific embodiments disclosed and described herein. The drawings are not necessarily to scale, emphasis instead being placed upon clearly illustrating the principles of the present teachings.

DETAILED DESCRIPTION

The following detailed description references the accompanying drawings that illustrate specific embodiments in which the present teachings can be practiced. The embodiments are intended to describe aspects of the present teachings in sufficient detail to enable those skilled in the art to practice the present teachings. Other embodiments can be utilized, and changes can be made without departing from the scope of the present teachings. The following detailed description is, therefore, not to be taken in a limiting sense. The scope of the present teachings is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Exemplary Aerial Device

FIG. 1 depicts an aerial device 100 of some embodiments. The aerial device 100 comprises a utility vehicle 112, a boom assembly 114, and a remote assembly system 300. The boom assembly 114 comprises a boom 118 having a boom proximal end 120 and a boom distal end 122. In some embodiments, the boom 118 is one of a telescoping boom 118 or an articulating boom 118. The boom assembly 114 may be attached to the utility vehicle 112 at the boom proximal end 120. The remote assembly system 300 may be secured to the boom distal end 122, such that the remote assembly system 300 is supported by the boom assembly 114. In some embodiments, and as described in greater detail below, the remote assembly system 300 may comprise at least a robot unit adapted for performing telecommunications repair, power line repair, general repair work, or other actions that may be performed by a robot. For example, the robot unit may comprise one or more utility tools for performing actions such as manipulating wire ties. The robot unit may also comprise utility tools for sawing, cutting, screwing, wiring, or other actions associated with repair work. In some embodiments, the boom 118 is used to position the remote assembly system 300 in a remote location, such as, for example adjacent to an energized power line.

As described herein, the robot unit may be controlled remotely by an operator 124 to perform actions, such as power line repair work. For example, the robot unit may be used for insulator removal and installation as described in embodiments herein. Through such remote control, the operator 124 is removed from any potentially dangerous situations.

Figure 3:
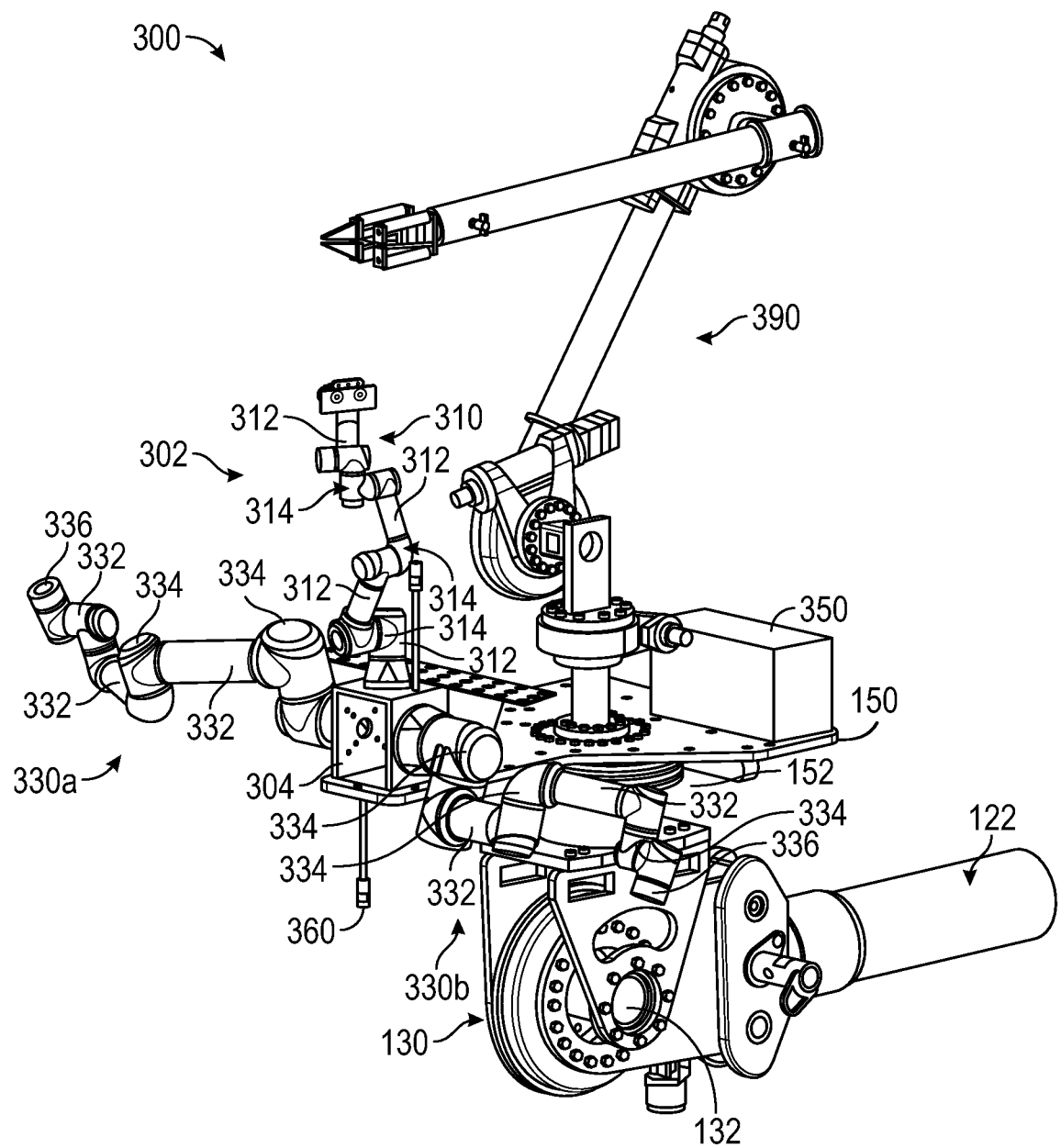
FIG. 3 is a first embodiment of a remote assembly system for some embodiments.
Figure 4:
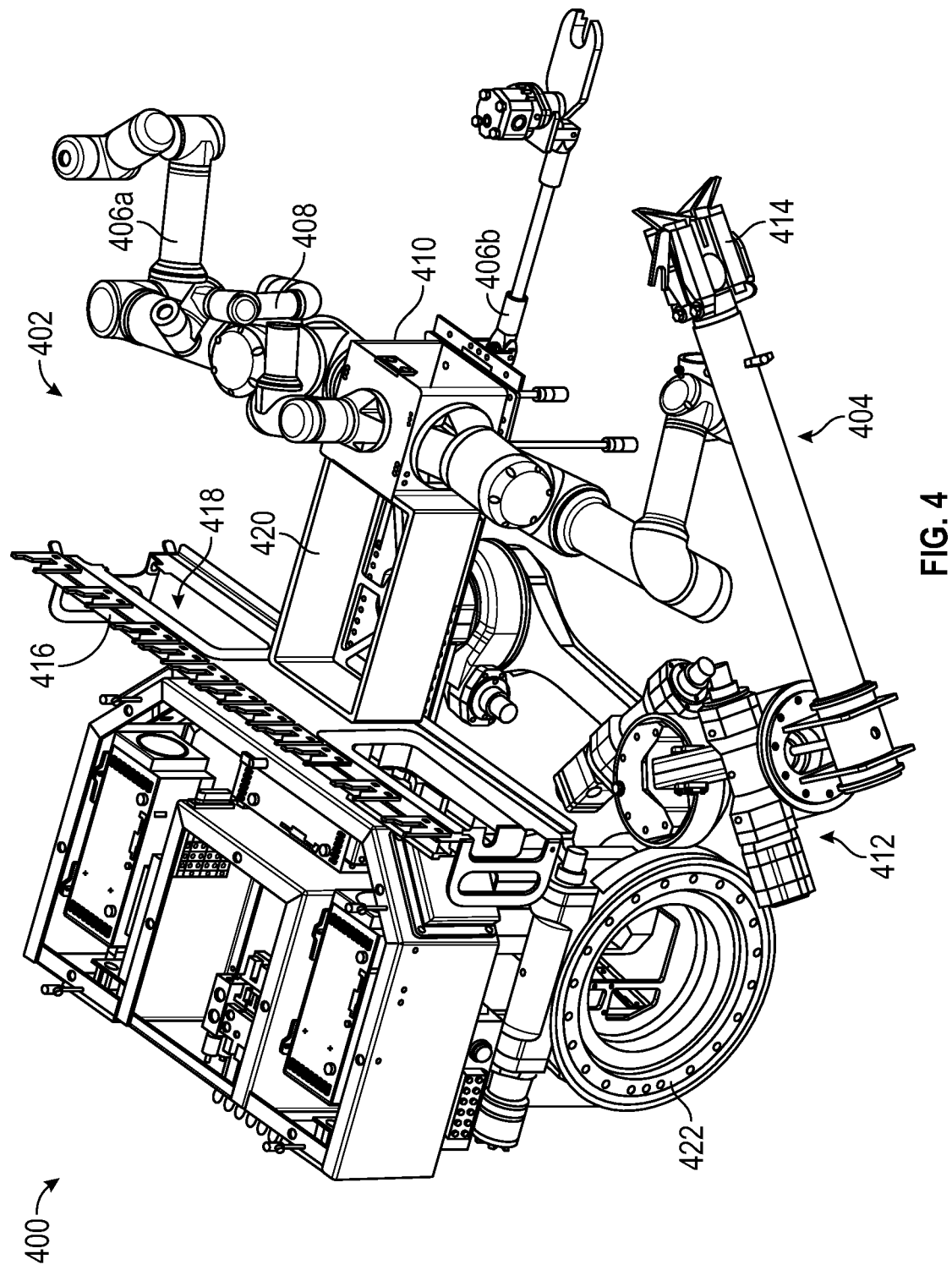
FIG. 4 is a second embodiment of the remote assembly system for some embodiments.

As shown, operator 124 is operating hand controls 126. Hand controls 126 may be any controller that may send a signal to aerial device 100 to control movement of boom assembly 114, utility vehicle 112, and remote assembly system 300. Hand controls 126 may comprise any switches, buttons, knobs, and sensors for detecting movement for controlling any displays associated with head-mounted display 128 and actuators associated with aerial device 100, robot units 302, 402 (FIGS. 3-4) and high-capacity manipulator arm 390 and jib 404 (FIGS. 3-4).

To provide the operator 124 with visual, sensory, and other information, the robot unit may further comprise a sensory capturing system comprising at least a camera and a three-dimensional depth camera. Video information may be provided to the operator through a virtual reality ("VR") headset and the operator 124 may issue commands through joysticks or other controllers to instruct the robot unit to perform an action. To aid the operator 124 and/or the robot unit in performing actions efficiently and correctly, three-dimensional depth information may be captured by the three-dimensional depth camera for generating a three-dimensional representation of the field of view at a computer. Accordingly, the computer can receive instructions, compare the instructions to the three-dimensional representation, and cause the robot unit to perform an action based on the instructions and the three-dimensional representation. To further aid in providing a realistic and immersive experience to the operator 124, the robot unit may comprise a six degree-of-freedom ("DOF") camera mount for mimicking or replicating the movement of the operator. Accordingly, in addition to movement in the x, y, and z planes, the robot unit can further control pitch, yaw, and roll of the camera mount. However, it will be appreciated that particular embodiments and applications of the present teachings may vary, including any of the examples provided herein. For example, the present teachings may be utilized in a variety of applications, including but not limited to military applications, construction applications, rescue applications, health and safety applications or other applications that robotics may be utilized. Accordingly, it will be appreciated that specific embodiments or details provided herein are intended to be illustrative, rather than limiting.

Exemplary System Architecture

Figure 2:
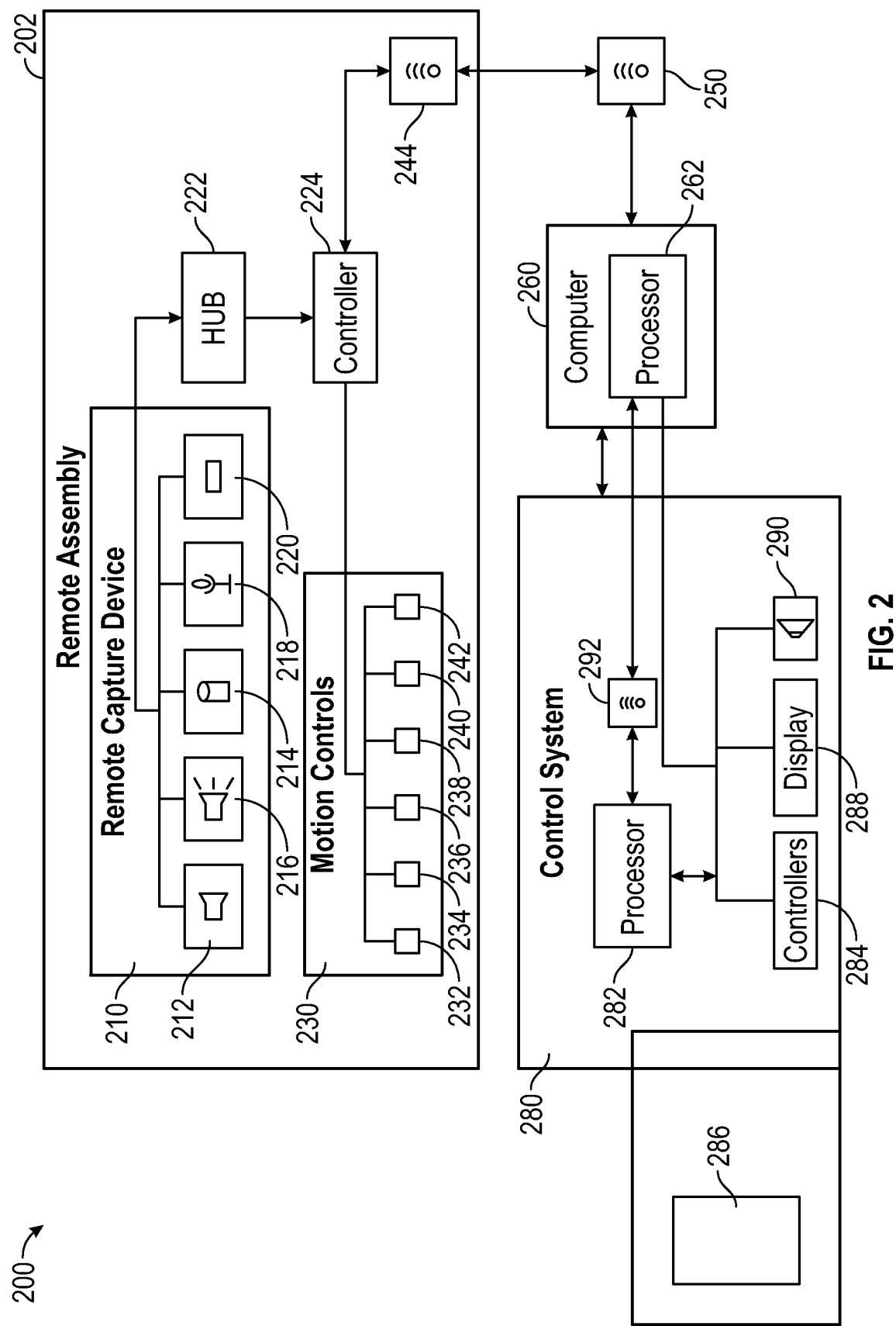
FIG. 2 is an exemplary system architecture of a robot unit and manual controls for some embodiments.

FIG. 2 depicts an exemplary block diagram 200 related to embodiments of the present teachings. In some embodiments, the remote assembly system 300 comprises various assemblies, sub-assemblies, parts, or components for capturing sensory information and/or for performing actions, such as repair work in a telecommunication setting. The remote assembly system 300 may comprise various circuitry, parts, or other components for capturing sensory information, including video, three-dimensional depth information, audio, and other sensory data. Further, the remote assembly system 300 may comprise a manually controlled or autonomous robot unit that may be positioned at the end of the boom assembly 114 for interacting with a work site to perform one or more tasks. For example, as described above, in many real-life scenarios, tasks to be performed may not be discovered until reaching the job site, and accordingly, the robot unit may comprise a variety of tools, features, or functions to respond to a variety of different tasks. Additionally, as described in greater detail below, the remote robot assembly may further comprise one or more parts, components, or features for providing an operator with sensory information, providing operator 124 with additional information about the job site to improve efficiency, efficacy, and/or safety of both the remote assembly system 300 and operator 124.

As depicted in the block diagram 200, a remote assembly 202 comprises at least a remote capture device 210, a computer 260, and a control system 280. In some embodiments, and as described in greater detail herein, the remote capture device 210 may be a device configured and adapted for the capturing of sensory information and may be positioned on a robot unit for the capturing of sensory information that may be utilized by computer 260, to present information to an operator via control system 280, among other purposes. FIG. 2 depicts exemplary sensors, cameras, and other apparatuses that may be utilized by remote capture device 210 for the capturing of sensory information. As described in greater detail below, remote capture device 210 may be mounted or positioned on a selectively movable mount or portion of a robot unit. For example, the robot unit may be a robot unit positioned at the end of a boom assembly for aerial applications. However, remote capture device 210 may also be used with a robot unit that is not attached on a boom assembly, and for example, may be utilized with a robot unit for ground application or attached to a mechanical arm or an aerial drone. Accordingly, via the robot unit, sensory information may be captured by remote capture device 210.

Through selective inputs, including both manually inputted instructions and/or automated instructions, remote capture device 210 may capture video, still images, three-dimensional depth information, audio, electrical conductivity, voltage, among other information that may be captured by a sensor or recording device. For example, remote capture device 210 may comprise at least one camera 212 for the capturing of video or still images (collectively, "video"). The at least one camera 212 may be a camera positioned on remote capture device 210 for the capturing of video within a selected field of view. The resolution of the video captured by camera 212 may vary, but in some embodiments, camera 212 may be a camera configured for capturing in at least 720p resolution but may capture in higher resolution including but not limited to 1080p, 2K, 3K, 4K, or 8K resolution. However, it will be appreciated that the camera 212 may be any currently known or yet to be discovered camera for capturing video. Video captured from camera 212 may be stored locally at remote capture device 210 at a local memory 214. The storing of video at local memory 214 may aid in providing a failsafe or backup storage of captured video in the event of a transmission or upload failure. Further, the storing of video at local memory 214 may aid in situations of poor wireless connection or if a direct line becomes loose or interrupted, preventing the immediate transmission of captured video. Optionally or additionally, video captured from camera 212 may be transmitted to computer 260 for processing, analyzing, storage, and/or for later transmitting to control system 280. In further embodiments, video captured from camera 212 may be directly transmitted to control system 280 for processing.

In some embodiments, remote capture device 210 may further comprise at least one three-dimensional camera 216 or other device configured for capturing three-dimensional depth information. As described in greater detail below, the three-dimensional depth camera 216 may be utilized for capturing three-dimensional depth information within a field of view for creating a point cloud, 3-D model, or other digital representation of an object or area scanned or viewed by the three-dimensional camera 216. Three-dimensional camera 216 may be operated in conjunction with, or independent from camera 212 or other components or parts of remote assembly 202 and/or remote capture device 210. As described in greater detail below, in response to instructions or an input, three-dimensional camera 216 may begin capturing three-dimensional depth information about an object or area within a field of view. Like the captured video with respect to camera 212, the three-dimensional depth information captured by three-dimensional camera 216 may be saved locally at memory 214. In some embodiments, remote capture device 210 may comprise a separate memory 214 for video captured by camera 212 and a separate memory 214 for three-dimensional information captured by three-dimensional camera 216. As described in greater detail below, remote capture device 210 may comprise a microphone 218 and/or at least one sensor 220 for capturing additional sensory information. Accordingly, in some embodiments, a separate and distinct memory 214 may be used for each sensory capture device (i.e., camera 212, three-dimensional camera 216, microphone 218, and/or sensor 220). In further embodiments, remote capture device 210 may comprise a single memory 214 for the storing of all captured sensory information. As described above and in further embodiments, three-dimensional information may be directly sent to computer 260 in addition to or instead of storing locally at memory 214.

In addition to capturing video and/or three-dimensional information, it may also be advantageous for remote capture device 210 to capture additional sensory information that may be presented to an operator or processed by computer 260. For example, in certain scenarios it may be advantageous for remote capture device 210 to capture audio via at least one microphone 218. Continuing with the running example, a remote assembly 202 for use with telecommunications repair may utilize audio information for diagnostic or safety purposes. For example, audio information may capture the sounds of the job site and the audio information may be processed to determine if a job site is safe. Accordingly, in some embodiments, remote capture device 210 may comprise at least one microphone 218 for the capturing of audio information. Similar to the video and three-dimensional information as described above, captured audio information may be stored locally at a memory 214 and/or transmitted to a computer 260 and/or control system 280.

Similar to audio information, remote capture device 210 may further comprise one or more sensors 220 for the capturing of additional sensory information, metrics, or data. For example, continuing with the running example, the remote capture device 210 may be used with a remote assembly 202 positioned at the end of boom assembly 114 for telecommunication or power line work. In such a work application, the remote assembly 202 may be working on or near live power lines or other conductive lines transferring electricity. Accordingly, in some embodiments, remote capture device 210 may comprise at least one sensor 220 configured as an electricity sensor for determining whether a cable or power line has electricity running through it. However, it will be appreciated that remote capture device 210 may comprise additional sensors 220 configured and adapted for providing remote capture device and/or remote assembly 202 with additional information. By way of a non-limiting example, sensor 220 may comprise any of the following sensors: a gyroscope, an accelerometer, a thermometer, a barometer, a light emitter, a voltage detector, a weight-detection sensor, QR reader, magnetometers, pose sensor, rotary encoder, among other sensors that may be utilized in various applications of remote assembly 202.

For example, in some embodiments, at least one sensor 220 may be adapted and configured as a sensor for estimating the weight of an object. As described in greater detail below with respect to FIG. 3, in some embodiments, comprises a remote assembly comprising a robot unit to perform fine tuning or other dexterous actions and a heavy load bearing utility arm for holding and moving heavy loads. To aid an operator in determining whether the robot unit for fine tuning work can safely hold or manipulate an object, at least one sensor 220 may be a weight estimator. For example, the weight estimator may utilize point cloud weight estimation to estimate the weight of an object. The weight estimator may capture various images of an object for the generation of a point cloud based on the object. By way of non-limiting example, the weight estimator may capture an image of a powerline transformer. The generated point cloud image may determine the transformer comprises a diameter of 13.4" and a height of 15.8." Based on this information, a determination may be made that the transformer comprises a weight of 472.9 Lbs. This information may be presented to computer 260 or an operator in the manner described below, and the computer 260 and/or operator 124 may make a determination as to whether the robot unit or the heavy load bearing utility arm can safely hold and move an object.

Further, in some embodiments, at least one sensor 220 may be a quick response ("QR") reader for reading QR codes. For example, in some applications, remote assembly 202 may be applied in a scenario in which objects or assets may be applied with or comprise a QR code. Through utilization of a QR reader, information about the object or asset may be quickly ascertained and provided to computer 260 and/or an operator. Non-limiting examples of information that may be obtained through a QR reader may be the BIM specifications of an object, such as weight, size, lifting points, ratings, etc. It should be understood however, that any information about the object or asset may be ascertained through QR reading.

It should be understood that in some embodiments, remote assembly 202 may comprise a plurality of remote capture devices 210. Further, each of the remote capture devices 210 in the plurality of remote capture devices 210 may comprise varying components (I.e., camera 212, three-dimensional camera 216, sensor 220, etc.). Even further, each remote capture device 210 in the plurality of remote capture devices 210 may comprise uniform components. For example, as described above, remote capture device 210 may be used with a boom-mounted robot unit comprising a camera mount and at least one utility arm. A remote capture device 210 comprising camera 212, three-dimensional camera 216, and microphone 218 may be paired or positioned on the camera mount. Simultaneously, a second remote capture device 210 comprising a sensor 220 for detecting an electric voltage and a microphone 218 may be paired or incorporated into the utility arm.

In some embodiments, the remote assembly 202 further comprises at least one digital Hub 222. The digital Hub 222 may receive the captured sensory information from remote capture device 210 and convert the captured sensory information into a format suitable for transmitting to computer 260 and/or control system 280. In some embodiments, the digital Hub 222 is a USB Hub, such as, for example, a USB 3.0. In further embodiments, sensory information may be captured using Ethernet cameras or Ethernet coupled capture devices. Accordingly, in some embodiments, digital Hub 222 may be replaced, substituted, or used in conjunction with an ethernet switch. It should be understood that sensory information may be captured in a variety of different formats. Accordingly, remote assembly 202 may utilize any hardware or software for receiving, analyzing, and/or transmitting sensory information.

As further depicted in FIG. 2, remote assembly 202 may further comprise a controller 224. In some embodiments, controller 224 may be a processor or other circuitry or computer hardware for receiving commands or instructions from control system 280 and/or computer 260 and for relaying or providing commands to remote capture device 210 and/or motion controls 230. Accordingly, in some embodiments, instructions, or commands from controller 224 may be sent to remote capture device 210. For example, instructions sent from controller 224 to remote capture device 210 may include instructions to begin recording video via camera 212. However, it will be appreciated that instructions sent from controller 224 may cause any of the components of remote capture device 210 to begin capturing sensory information, including but not limited to three-dimensional information, audio information, or other sensory information captured by any of the sensors 220 of remote capture device 210. Additionally, controller 224 may be used to send instructions to cause remote assembly 202, remote capture device 210, and/or motion controls 230 to perform other actions corresponding to the instructions. For example, instructions from controller 224 may instruct remote capture device 210 to store captured sensory information on memory 214. Additionally, instructions from controller 224 may be sent to motion controls 230 to instruct remote assembly 202 to perform a movement. Further, controller 224 may be in communication with transceiver 244 for communicating with computer 260 and/or control system 280 to send sensory information or other data or information to computer 260 and/or control system 280. Similarly, controller 224 may further be configured for receiving instructions, commands, or other information from computer 260 and/or control system 280. It should be understood that in further embodiments, controller 224 is not required to be directly coupled or incorporated into remote assembly 202. For example, remote assembly 202 may be incorporated into or be a component of a computer 260 and/or control system 280. Accordingly, in some embodiments, controller 224 may be incorporated into or directly paired with computer 260 and/or control system 280. In such embodiments, instructions, commands, or other communications may be sent from controller 224 to remote assembly 202. Remote assembly 202 may comprise computer hardware capable of receiving the transmitted instructions, commands, or communications from controller 224. For example, in some embodiments, it may be advantageous for controller 224 to be incorporated into a high-powered computing system that can transmit information to remote assembly 202.

As further depicted in the block diagram of FIG. 2 and in some embodiments, remote assembly 202 may further comprise motion controls 230. Motion controls 230 may be configured and adapted for controlling the movement of remote assembly 202, including any utility arms or camera mounts as described in greater detail below. In some embodiments, remote assembly 202 may comprise a 6 DOF robot unit configured with utility arms and/or camera mounts that can move with 6 DOF. Accordingly, motion controls 230 may be configured to provide instructions or commands to remote assembly 202 to move in 6 DOF. In some embodiments, motion controls may comprise x-axis control 232, y-axis control 234, z-axis control 236, pitch control 238, yaw control 240, and/or roll control 242 for moving remote assembly 202 with 6 DOF. It will be appreciated however, that remote assembly 202 may comprise varying designs, and in some embodiments, may move in fewer than 6 DOF. Accordingly, in further embodiments, motion controls 230 may comprise controls configured and adapted for moving remote assembly 202 in an appropriate number of planes.

As described above, motion controls 230 may be in communication with controller 224. Instructions or commands from controller 224 may be sent to motion controls 230. Upon receipt of the instructions, the corresponding controls 232, 234, 236, 238, 240, and/or 242 may be instructed to cause movement of the remote assembly 202 based on the received instructions. As described above, one or more arms or limbs of remote assembly 202 may be configured to move with 6 DOF. Based on the instructions, the corresponding motion controls 230 may cause movement of the remote assembly 202 to correspond to the instructions.

As described above, remote assembly 202 may be communicatively coupled to computer 260. In some embodiments, computer 260 may be directly coupled to remote assembly 202, such that computer 260 and remote assembly 202 are a combined system. For example, computer 260 may be directly installed into a frame or body of remote assembly 202. Accordingly, remote assembly 202 and computer 260 may be in direct communication through cables or other direct methods. In further embodiments, computer 260 may be located external to remote assembly 202. When located externally, remote assembly 202 and computer 260 may nevertheless be communicatively coupled. For example, in some embodiments, remote assembly 202 and computer 260 may be coupled through a physical connection such as an Ethernet cable or USB cable. In further embodiments, remote assembly 202 and computer 260 may be coupled through a wireless connection, such as Wi-Fi, BLUETOOTH®, cellular connection, or another wireless connection. In embodiments in which computer 260 and remote assembly 202 are connected through a wireless connection, transceiver 244 may communicate with another transceiver 250 coupled or otherwise in communication with computer 260.

In some embodiments, computer 260 may receive and process sensory information captured by remote capture device 210 of remote assembly 202. Accordingly, computer 260 may comprise at least a processor 262 for executing commands, which may include instructions (e.g., computer-executable instructions) for processing, analyzing, or utilizing captured sensory information. For example, as described in greater detail below, computer 260 may utilize captured three-dimensional information to generate a point-cloud, three-dimensional model, or other digital representation of an object or area captured by remote capture device 210. In further embodiments, computer 260 may be in communication with one or more databases or data storages. For example, computer 260 may be in communication with a database comprising information directed to product or object information in a telecommunication or powerline setting. This may be particularly beneficial for obtaining information about particular objects or products that may be encountered in the application of various embodiments. For example, described above, remote assembly 202 may comprise a weight estimator utilizing a point cloud for estimating weight of an object. Computer 260 may utilize the data obtained by weight estimator in making an estimation about the weight of the object. In further embodiments and as described above, remote assembly 202 may comprise a QR reader for identifying assets or objects. Once a QR code is scanned, computer 260 may access the storage or database to identify information about the asset or object.

In some embodiments, control system 280 may be an interface, apparatus, or system providing a user with an interactive medium for interacting with computer 260 and/or remote assembly 202. For example, in some embodiments, control system 280 may comprise at least a processor 282, at least one controller 284, at least one display 288, at least one sensor 290, and at least one transceiver 292. As described in greater detail below, some embodiments of the present teachings provide for a method of controlling remote assembly 202 from a remote location. Continuing with the running example, telecommunications repair or power line repair sometimes occurs during or immediately after a severe weather storm. This type of scenario can be wrought with dangers such as exposed and live power lines, high winds, lightning, and other dangers that pose a risk to human workers. Accordingly, it may be advantageous for an operator of remote assembly 202 to control remote assembly 202 in a safe location, such as in a work truck or building away from the job site. Accordingly, control system 280 may comprise at least one interfacing controller 284, providing an interactive means for a user to input commands or instructions for controlling or manipulating remote assembly 202. Controller 284 may be any interface for inputting commands or instructions that can be transmitted and processed by a computer or other hardware. By way of non-limiting example, controller 284 may comprise hand-held motion control controllers. As described in greater detail below, the motion control controllers may be beneficial for an operator to perform specific movements or actions that can be captured and relayed to remote assembly 202 to perform. Through the use of motion-control controllers, an operator may be provided with a sensory effect similar to being at the job site and performing the actions themselves. However, controller 284 is not limited to motion controls and instead, controller 284 may be any interface for an operator to input instructions or commands for remote assembly 202. For example, in further embodiments, controller 284 may be a handheld controller, similar to that of a video game controller comprising thumb sticks, buttons, triggers, and/or other interfacing inputs. In further embodiments, controller 284 may comprise a joystick and button design. In even further embodiments, controller 284 may be a mouse and keyboard. In even further embodiments, controller 284 may be configured as a glove or interactive model of a hand, allowing an operator to perform native hand manipulations which may be captured and transmitted to remote assembly 202. In even further embodiments, controller 284 may comprise a camera component or other motion capture component for capturing the movement of an operator. For example, in addition to, or in place of a physical controller handled by operator 124, a camera component may capture the movement of operator 124. The captured movement may be transmitted to computer 260 for translation or mapping movement of remote assembly 202. Optionally, or additionally, motion capture aids, such as motion capture dots, may also be used for capturing movement of operator 124. In further embodiments, operator inputs may further be captured through AC electromagnetic tracking. In even further embodiments, operator inputs may further be captured through an active force feedback imitative control. In even further embodiments, operator inputs may be further captured through a passive force feedback imitative control. It will be appreciated that the examples provided herein are intended to be illustrative, rather than limiting, and that controller 284 may be any apparatus or method of receiving instructions or an input from an operator or computer for autonomous control.

In some embodiments, control system 280 may further comprise a power medium 286 for powering one or more parts or components of control system, including for example controller 284, display 288, or the at least one sensor 290, or any combination thereof. In some embodiments, a single power medium may power all parts or components of control system 280. In further embodiments, individual parts, or components of control system 280 may comprise a separate and distinct power medium 286. For example, a first power medium 286 may be used for powering controller 284 and a second power medium 286 may be used for powering display 288. Power medium 286 may be any conventionally known power source for providing power to an electrical device, including but not limited to an internal power source such as a battery, or an external battery source such as an electrical outlet.

As further depicted in FIG. 2, control system 280 may further comprise at least one display 288. In some embodiments, display 288 may be a monitor, touchscreen, television screen, or any other display. In some embodiments, at least a portion of the captured sensory information from remote capture device 210 may be displayed on display 288 for an operator to view. For example, captured video may be displayed on display 288. Providing sensory information on display 288 may provide an operator with a more immersive feel when remotely operating remote assembly 202. Through a real-time video feed, an operator may experience the job site as if operator 124 is physically present, even if operator 124 is in a safe location miles away. Additionally, providing sensory information to an operator via display 288 may aid operator 124 in inputting instructions or commands via controller 284.

In some embodiments, control system 280 may further comprise at least one sensor 290, which may provide additional sensory affect to operator 124 and/or capture additional inputs that may be used by computer 260 to provide instructions to remote assembly 202. In some embodiments, one or more sensors may be combined with controller 284 and/or one or more sensors may be combined with display 288. For example, in some embodiments, sensor 290 may be at least one speaker or sound emitting device to provide operator 124 with audio information captured from remote capture device 210 or pre-recorded or pre-rendered audio. In further embodiments, the at least one sensor 290 may be one of an inclinometer, an accelerometer, a gyroscope, a light sensor, magnetometers, pose sensors, rotary encoders, or any other type of sensor 290 suitable to detect the viewing angle of the user or the movement, position, or angle of the operator's body.

In some embodiments, and as described in greater detail below, an operator may utilize controller 284, display 288, and the at least one sensor 290 to provide instructions to remote assembly 202, which may be analyzed and translated into instructions to cause remote assembly 202 to move or perform an action. As also described in greater detail below, an operator may input instructions or commands through control system 280. In some embodiments, inputs may be inputted or captured by a combination of controller 284 and display 288. For example, display 288 may be coupled to a head-mounted unit as described in greater detail below. An operator may move their head or torso with sensor 290 capturing the movement and/or viewing angle of operator 124. The captured movement data or viewing angle may be sent to computer 260 via transceiver 292, and computer 260 may take the captured movement data or viewing angle and translate into instructions for causing remote assembly 202 to move and mimic or replicate the operator's movement and match the viewing angle of the operator.

Exemplary Hardware

FIG. 3 is an exemplary embodiment of a remote assembly system 300. In some embodiments, the remote assembly system 300 may comprise various assemblies, sub-assemblies, parts, or components, including but not limited to a robot unit 302 affixed at the end of a boom assembly 114. Further, the remote assembly system 300 may correspond to the remote assembly 202 as described above with respect to FIG. 2 and may comprise any and all of the components or parts as described above. In some embodiments, robot unit 302 may be configured and adapted to receive instructions from a computer or operator to perform a corresponding movement or action. In some embodiments, robot unit 302 may be a fully manually controlled robot, wherein the robot unit 302 will not perform a movement or action absent an instruction provided from an operator. In further embodiments, robot unit 302 may be a fully automated robot, wherein the robot unit 302 performs actions or movements based on pre-programmed instructions for automation. In even further embodiments, robot unit 302 may be a robot configured to respond to both manually inputted instructions and automated programming. The various movements or actions performed by robot unit 302 and described herein may be performed based on manually provided instructions and/or automated programming. Accordingly, embodiments of the present technology are anticipated to support fully autonomous control, fully manual control, or a hybrid (semi-autonomous) control wherein operator 124 is interacting with and providing manually provided inputs along with automated inputs to control remote assembly system 300.

As described above and as illustrated in FIG. 3, in some embodiments remote assembly system 300 may be positioned at the distal end 122 of boom assembly 114. As used herein, remote assembly system 300 and system 300 may be used interchangeably. As depicted, in some embodiments, distal end 122 of boom assembly 114 may comprise a pivot joint 130 comprising a motor 132. In some embodiments, pivot joint 130 may be used to change an angle or position of remote assembly system 300. In further embodiments, pivot joint 130 may be paired with a sensor, such as an inclinometer paired with a rotary encoder for closed-loop feedback, to aid in maintaining a leveled position of remote assembly system 300. However, pivot joint 130 may comprise any sensor, including but not limited to magnetometers, pose sensors, rotary encoders, among other sensors. As further depicted in FIG. 3, pivot joint 130 may further act as an attachment point between remote assembly system 300 and boom assembly 114. For example, base 150 may be coupled to pivot joint 130. Base 150 may be adapted and configured for receiving and coupling remote assembly system 300. Accordingly, through such coupling, remote assembly system 300 may be secured and attached to boom assembly 114. In some embodiments, base 150 may comprise a generally planar design for accepting and securing one or more assemblies, sub-assemblies, parts, or components of remote assembly system 300. Further, the size and shape of base 150 may vary, and may be dependent on the design of remote assembly system 300. Further, in some embodiments, base 150 may further comprise a motorized turntable 152. Motorized turntable 152 may be a power motor train system for rotating base 150. The rotation of base 150 may be advantageous for positioning remote assembly system 300 during use. In some embodiments, the various assemblies, sub-assemblies, parts, and/or components of system 300 may be adapted and configured to be selectively and removably attached to boom assembly 114. For example, utility vehicle 112 may be driven to a job location with a bare boom assembly 114, with the various assemblies, sub-assemblies, parts, and/or components of system 300 stored in or on utility vehicle 112. Once at the job site, system 300 may be assembled for use. This may be advantageous for protecting aspects of system 300 during transit.

In some embodiments, remote assembly system 300 may generally comprise a robot unit 302. Robot unit 302 may be a controllable robotics unit that can perform a range of movements and actions, such as performing repair work in a telecommunications setting. In some embodiments, and as described in greater detail below, robot unit 302 may be a 6 DOF robotics assembly, configured and adapted for mimicking the movement of an operator utilizing a VR controller. Particularly, through a 6-DOF configuration, robot unit 302 may substantially mimic the torso, neck, and arm movements of operator 124. Through such movement, robot unit 302 may perform a greater range of movements and/or provide a more immersive experience to an operator than pre-existing systems.

In some embodiments, robot unit 302 may comprise a central hub 304. Central hub 304 may be a central housing or base, which may house a processor, a power source, circuitry, a wireless communication means among other electronics for robot unit 302, including the components described above with respect to FIG. 2. Additionally, central hub 304 may act as a coupling or attachment member, securing robot unit 302 to base 150. Even further, central hub 304 may also act as a receiving point for one or more parts or components of robot unit 302. For example, and as described below, robot unit 302 may comprise at least one utility arm and at least one camera mount. Accordingly, central hub 304 may receive and couple with the at least one utility arm and the at least one camera arm.

To collect sensory information, including but not limited to video and three-dimensional depth information, robot unit 302 may comprise at least one camera mount 310. Camera mount 310 may be a 6 DOF, selectively controllable robotic arm, that may couple to central hub 304. As described in greater detail below, robot unit 302 may receive movement instructions or commands from computer 260 that may cause camera mount 310 to move or change position. For example, camera mount 310 may correspond to a head mount or other capture apparatus to capture the viewing angle of an operator. Instructions or commands may be communicated to robot unit 302 causing camera mount 310 to move in a corresponding manner to match the viewing angle of operator 124. To enhance operator 124 experience, camera mount 310 may comprise a plurality of camera mount segments 312 that may be separated by motorized pivotable joints 314. The number and size of camera mount segments and pivotable joints 314 may vary depending on the embodiments and application of robot unit 302. Generally, in response to an instruction or commands, one or more of the pivotable joints 314 may activate to rotate or move camera mount 310. In some embodiments, the pivotable joints 314 may be used to move camera mount 310 in the X-axis, Y-axis, Z-axis as well as control the roll, pitch, and yaw of the camera mount 310. Accordingly, through movement in the 6 DOF, camera mount 310 may mimic or replicate the viewing angle of operator 124. As further depicted in FIG. 3, a distal end of camera mount 310 may further comprise a sensory capture device.

As described above, robot unit 302 may be adapted for performing repair work, maintenance work, or other similar situations, tasks, or actions. To perform these actions, robot unit 302 may comprise at least one utility arm. The depicted embodiment as illustrated in FIG. 3 illustrates an exemplary embodiment of robot unit 302 comprising two utility arms 330a, 330b. Like camera mount 310 as described above, each of utility arms 330a, 330b may comprise a plurality of utility arm segments 332 that may be separated by motorized pivotable joints 334. The number and size of utility mount segments 332 and pivotable joints 334 may vary depending on the embodiments and application of robot unit 302. Generally, in response to an instruction or commands, one or more of the pivotable joints 334 may activate to rotate or move utility arms 330a, 330b. In some embodiments, the pivotable joints 334 may be used to move utility arms 330a, 330b in the X-axis, Y-axis, Z-axis as well as control the roll, pitch, and yaw of utility arms 330a, 330b. Accordingly, through movement in the 6 DOF, each utility arm 330a, 330b may mimic or replicate the movement of an operator's arms and hands. In some embodiments, the distal ends 336 of utility arms 330a, 330b may comprise one or more tools, flanges, or other apparatus for performing an action such as repair work. In some embodiments, distal ends 336 may comprise an adapter or may be otherwise configured for accepting a tool.

Remote assembly system 300 may further comprise a remote power source 350. In some embodiments, the remote power source 350 may be secured to the base 150. In further embodiments, remote power source 350 may be located within central hub 304. The remote power source 350 may be used to power camera mount 310, utility arm 330a, utility arm 330b, arm 390, or any combination thereof. Remote power source 350 may be an electric generator, batteries, or any other known power source.

In further embodiments, robot unit 302 may comprise one or more additional capture devices or sensors 360 for capturing additional information that may be analyzed and/or presented to a user or operator. For example, in some embodiments, robot unit 302 may comprise a thermometer or heat sensor for capturing heat information. In some embodiments, robot unit 302 may comprise an electrical sensor for capturing electrical data. For example, robot unit 302 may be used to work on power lines or in other scenarios involving live power lines or other electrically charged wires or circuitry. Accordingly, to avoid damage to the robot unit 302, the boom assembly 114, or the utility vehicle 112, at least one sensor 360 may be a sensor for detecting an electrical current. Additionally, robot unit 302 may comprise at least one sensor 360 that is at least one of an accelerometer, gyroscope, light sensor, or other sensors for detecting the positioning of camera mount 310, utility arm 330a, and/or utility arm 330b. As described in greater detail below, a sensor for detecting the positioning of robot unit 302 may aid in replicating or mimicking movement of an operator using motion controls.

In some embodiments, and as depicted in FIG. 3, in addition to robot unit 302, remote assembly system 300 may further comprise at least one heavy utility arm 390 or additional robotics assembly that may operate separately or in conjunction with robot unit 302. For example, in many robotics applications, a delicate balance is often considered when designing the features and capabilities of a robot. Typically, robotics adapted and configured for delicate work and fine adjustments are typically not capable of transporting or holding heavy loads. Conversely, robotics adapted and configured for holding or transporting heavy loads typically lack the structural components to perform delicate or fine-tuned actions. By way of non-limiting example, in telecommunication repairs, heavy parts may need to be lifted from the ground to a telecommunication pole. Lifting a heavy part may require a robotic system configured for transporting heavy loads. However, once in position, the part may need a robotic system configured for delicate or sophisticated operations to install the part in position. In some embodiments, robot unit 302 may be configured and adapted for performing movements or actions directed to sophisticated, delicate, or fine-tuning work, such as manipulating wire, cutting wire, loosening screws and bolts. In some embodiments, 300 may comprise at least one utility arm 390 for holding or transporting heavy loads that may be too heavy for robot unit 302 to safely hold and transport. Accordingly, through the combination of robot unit 302 and utility arm 390, remote assembly system 300 may perform both dexterous actions and load-bearing actions.

FIG. 4 illustrates an exemplary remote assembly system 400 comprising a robot unit 402 and a high-capacity manipulator or jib 404 in accordance with embodiments of the present disclosure. Robot unit 402 may be substantially similar to robot unit 302 discussed above. As shown, robot unit 402 may comprise a first utility arm 406a, a second utility arm 406b, and a camera mount 408. Utility arms 406a, 406b may be substantially similar to utility arms 330a, 330b discussed above. Camera mount 408 may be substantially similar to camera mount 310 discussed above. In some embodiments, utility arms 406a, 406b are configured to perform work operations, such as removing and installing parts (e.g., insulators) on a utility pole. In some embodiments, camera mount 408 is a camera-supporting robotic arm that provides operator 124 a view of the remote location as if operator 124 was themselves in the remote location. Utility arms 406a, 406b and camera mount 408 may be coupled to a central hub 410 (corresponding to central hub 304 in some embodiments). Central hub 410 may have dimensions approximating a human torso such that utility arms 406a, 406b extend off opposite lateral sides of central hub 410 to mimic the arms of operator 124, while camera mount 408 may extend off a top surface of central hub 410 to mimic the head of operator 124, thereby allowing a remote operator to operate robot unit 402 in a manner that mimics that operator 124 was in the remote location performing the energized power line work.

Jib 404 may be substantially similar to arm 390 discussed above (e.g., may comprise the same sensors, manage the same loads, etc.). In contrast to arm 390, jib 404 may work in or near the same lateral plane as utility arms 406a, 406b. Providing jib 404 in such a side-by-side configuration with arms 406a, 406b, may improve movement of robot unit 402 as compared to a remote assembly system 300 with an over-the-top arm 390. That is, robot unit 402 may be maneuverable through tighter spaces than remote assembly system 300 because the height of robot unit 402 is reduced due to the side-by-side arrangement. For example, when working on a 3-phase power line, robot unit 402 may fit between an upper phase and a lower phase without causing a phase-to-line fault because robot unit 402 may be able to maintain the minimum distances away from the phases due to the smaller overall height that is enabled by the side-by-side configuration.

A coupling assembly 412 may connect jib 404 to an underside of robot unit 402, below a receptacle (discussed further below). The coupling assembly 412 may comprise linkages, joints (e.g., pivot joints), and the like to connect jib 404 to robot unit 402. In some embodiments, coupling assembly 412 is configured to provide jib 404 with one-, two-, three-, four-, five-, or six-degrees of freedom. Jib 404 may also comprise an end effector 414, which may be interchangeable with other end effectors such that an appropriate end effector may be selected based on the work task to be performed. For example, as shown below in FIGS. 5A-5F, end effector 414 may be a vise (or other coupler) that couples to an energized phase on to electrically bond robot unit 402 to the energized phase for performing maintenance work on energized components of the power line. Jib 404 may further be configured to move the phase, e.g., to move the phase out of the way of robot unit 402 while robot unit 402 performs work on other power line components. Further details of the side-by-side configuration may be found in commonly-owned U.S. application Ser. No. 18/395,944, titled "AERIAL ROBOTIC SYSTEMS" the entirety of which is incorporated by reference herein.

Robot unit 402 may also comprise a tools holder 416 and parts holder 418. Tools holder 416 may store tools that are usable by utility arms 406a, 406b for operating on energized power lines and may include pin pullers (e.g., for decoupling a pinned connection as discussed further below), gripper tools for grabbing an object, and the like. In some embodiments, utility arms 406a, 406b are configured to automatically retrieve tools from tool holders 416 and put away tools into tool holders 416. For example, responsive to receiving an instruction to retrieve or store a tool, remote assembly system 400 may automatically perform the instructed action without requiring any further input from operator 124. Parts holder 418 may hold parts that remote assembly system 400 may use during a work operation, such as parts to be installed onto a utility pole. For example, parts holder 418 may hold an insulator that may be automatically retrievable by a utility arm 406a, 406b for installation onto the utility pole. Parts holder 418 may comprise a storage element (not shown), such as a foam receptacle or the like, for storing parts therein. As with tools holder 416, retrieving and/or storing a part from parts holder 418 may be an automatic operation carried out by remote assembly system 400. It is contemplated that utility arms 406a, 406b may be used to place and/or remove parts to/from jib 404 and/or end effector 414.

Robot unit 402 may further comprise a receptacle 420. Receptacle 420 may be disposed between parts holder 418 and central hub 410. Receptacle 420 may be configured as an open-faced box (or other open-faced geometrical shape) in which items may be placed. For example, utility arms 406a, 406b may remove an insulator from a utility pole and then place the removed insulator into receptacle 420 for later disposal. In some embodiments, utility arms 406a, 406b are configured to automatically place items into receptacle 420, e.g., in response to a command issued from an operator. Remote assembly system 400 may comprise a pivot joint 422 for coupling remote assembly system 400 to a supporting structure, such as a boom assembly 114. Pivot joint 422 may correspond to pivot joint 130 discussed above.

Automatic Bond on

Figure 5A:
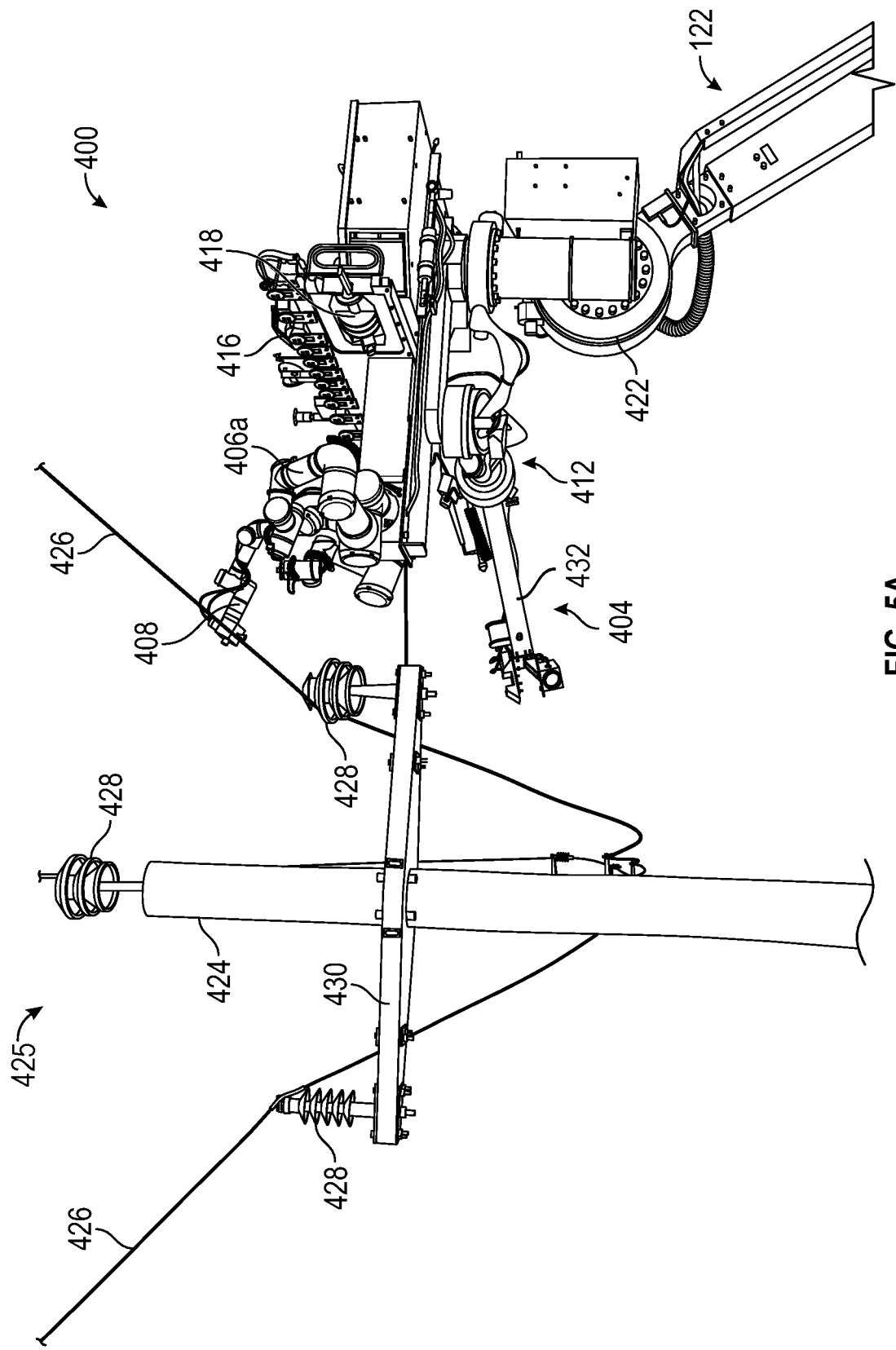
FIG. 5A illustrates the remote assembly at an energized power line for some embodiments.

Turning now to FIGS. 5A-5F, an automatic bond-on work operation for operating on power distribution lines 425 is illustrated in accordance with embodiments of the present disclosure. FIG. 5A illustrates an initial state of a work operation where remote assembly system 400 is not in contact with any component of power distribution lines 425. As shown, a power distribution line 425 comprises a utility pole 424 coupled to phases 426 via insulators 428. Insulators 428 may in turn be coupled to a cross-arm 430 and/or directly to the utility pole 424. The utility pole 424 may be a three-phase utility pole, for example, or any other type of power distribution system. For example, it is contemplated that the automatic bond on operations discussed herein may also be used on transmission power lines without departing from the scope hereof.

When performing operations on power distribution lines 425 using a remote assembly, such as remote assembly system 400, ensuring that operations are carried out safely is important to protect workers that may be on the ground, along with components of remote assembly system 400. For some operations on power distribution line 425, it may be desirable for robot unit 402 to be at a common electrical potential with the phases 426, while for other operations it may be desirable for robot unit 402 to be at earth potential while working on the grounded components of power distribution line 425. Remote assembly system 400 may be configured to automatically bond on and off to/from power distribution lines 425 based on the desired power line component to be worked on, as discussed further hereinafter. For example, when in a "home" position, remote assembly system 400 may be at a floating electric potential. From the floating electric potential, remote assembly system 400 may bond on to an energized component, such as phase 426 to operate on energized components, or on to a grounded component to operate at earth potential. The home position of remote assembly system 400 may be the position of remote assembly system 400 when remote assembly system 400 is not in contact with any other component.

In some embodiments, remote operations may be performed on power distribution lines 425 to replace an insulator 428 with a new insulator, for example. Replacement of an insulator 428 requires operations to be performed both on components that are at the electric potential of the phases 426 and components that are at earth potential. For example, a first end of insulator 428 may be coupled to an energized phase 426 via a first connector, and a second end of insulator may be coupled to a ground utility pole 424 via a second connector. To remove or install an insulator 428, operations may need to be performed on both connectors that are at different electric potential. Accordingly, safe operations need to be ensured when transitioning between working on components that are at the electrical potential of phases 426 and components that are at earth potential to prevent an earth fault. As previously discussed, power distribution lines 425 may comprise short gaps between energized and deenergized components such that incidental simultaneous contact with the two components is possible, which can lead to severe injury. This is in contrast to working on transmission power lines, where the physical distance between components at differing electrical potentials eliminates the risk of simultaneous contact with said components. Accordingly, it is important to provide systems and methods for working on distribution type lines while preventing simultaneous contact between grounded and energized components.

In some embodiments, robot unit 402 is prevented from crossing a minimum distance to an energized or grounded component based on the current state of robot unit 402. When robot unit 402 is in the equipotential state, robot unit 402 may be prevented from crossing a minimum distance to a grounded component that would lead to a line-to-ground fault. In some embodiments, the minimum distance is about 0.23 m (9") for grounded components. However, it will be appreciated by one of skill in the art that the minimum distance for a line-to-ground fault is a function of voltage, elevation, and system transients such that the minimum distance may be a distance other than 0.23 m When robot unit 402 is in the non-equipotential state, robot unit 402 may be prevented from crossing a minimum distance to an energized component. In some embodiments, the minimum distance is about 0.37 m (14.6") for energized components. Other distances may be used, e.g., a safety factor may be incorporated. In some embodiments, operation of robot unit 402 is locked responsive to a detection that robot unit 402 is near or is nearing the minimum distance that will cause a fault (e.g., crossing a threshold distance from the fault or accelerating at a rate that may lead to a fault, etc.)

To operate on power distribution lines 425, remote assembly system 400 may couple to phases 426 with jib 404, while arms 406a 406b carry out the maintenance tasks. The jib 404 may be electrically insulated from robot unit 402. For example, the jib 404 may comprise an insulating section 432 comprising electrically insulating material, such as fiberglass, that prevents current from passing through jib 404 to robot unit 402 when jib 404 contacts an energized component, such as phases 426. In some embodiments, insulating section 432 has a clear span of about 9 inches; however, it will be appreciated that the amount of clear span needed to ensure electrical insulation may depend on various factors, such as the voltage of phases 426, elevation, system transients, and the material of insulating section 432. Accordingly, insulating section 432 may have a clear span of less than or greater than 9 inches without departing from the scope hereof.

Figure 5C:
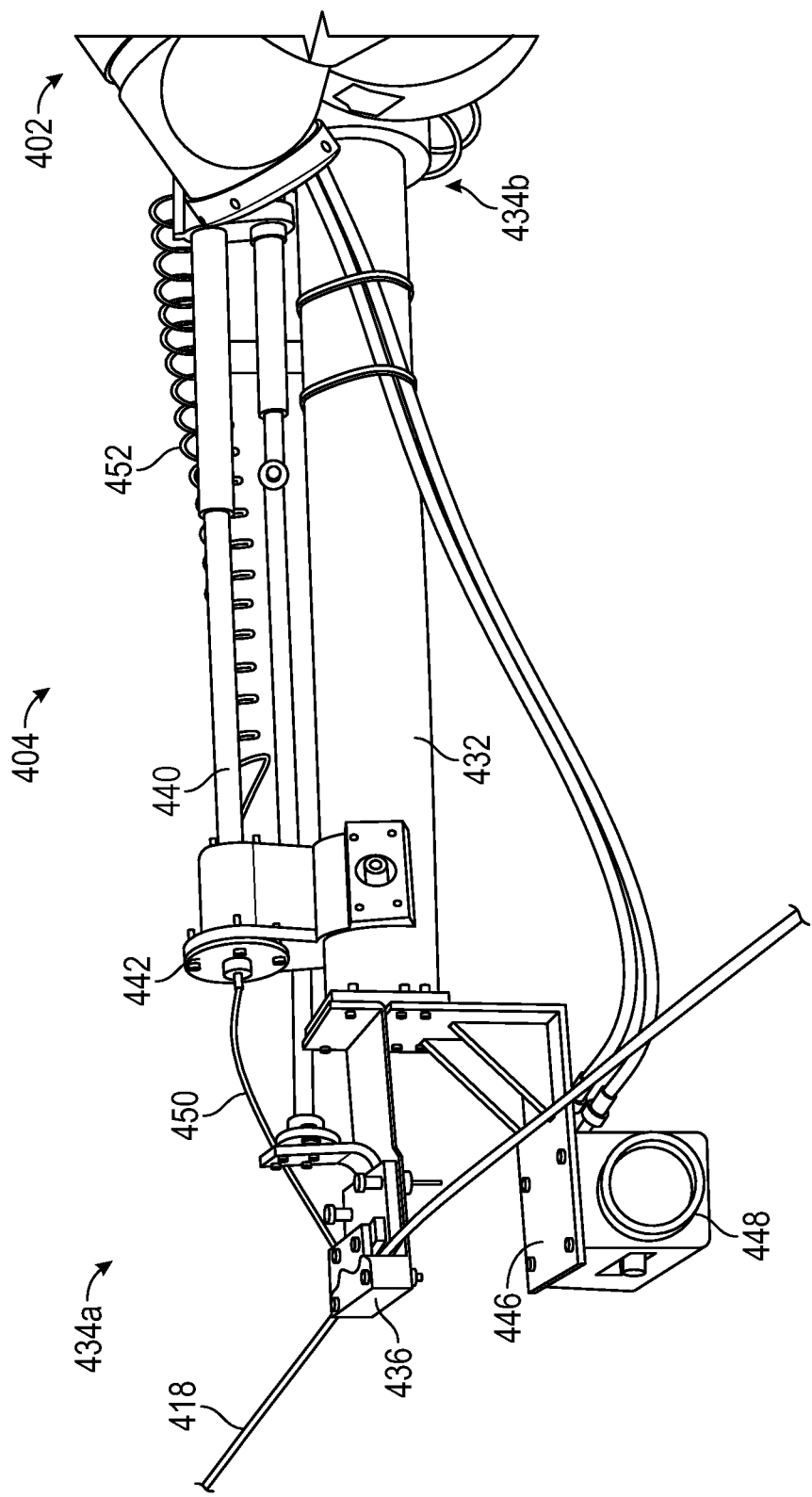

Reference is now made to FIGS. 5B and 5C where jib 404 is illustrated in greater detail. FIG. 5B illustrates jib 404 coupled to a phase 426 while robot unit 402 is not electrically bonded to the phase 426, and FIG. 5C illustrates jib 404 coupled to phase 426 with robot unit 402 electrically bonded to phase 426. Robot unit 402 is referred to as being in an equipotential state when bonded to an energized phase 426, and as being in a non-equipotential state when not bonded to an energized phase 426 (e.g., when robot unit 402 is at earth or floating potential). As previously discussed, boom distal end 122 may be electrically isolating such that remote assembly system 400 is at floating electric potential when remote assembly system 400 is not in contact with any other components.

Jib 404 may comprise a distal end 434a and a proximal end 434b with insulating section 432 electrically insulating distal end 434a from proximal end 434b. Proximal end 434b is coupled to robot unit 402. Distal end 434a may comprise a vise 436 (corresponding to end effector 414 discussed above) for coupling to a phase 426. While a vise 436 is shown, generally any end effector 414 that can couple to phase 426 is within the scope hereof. For example, a spring-loaded latch, a two-finger clamp, a crow's hook, or other similar grasping devices may be used without departing from the scope hereof. Coupling vise 436 to phase 426 places vise 436 at an equal electric potential to phase 426, while insulating section 432 is electrically insulating to maintain proximal end 434b at earth or floating potential. Vise 436 may have dimensions larger than dimensions of phase 426 to ensure that electrical contact is made between vise 436 and phase 426. For example, vise 436 may have a height that is at least 1.5× greater than a height (e.g., diameter) of phase 426. Vise 436 may also be tightly closed to ensure that all or substantially all of the surface area of vise 436 is in contact with vise 436. Vise 436 may be formed of an electrically conductive material. Other end effectors for electrically connecting to phases 426 are within the scope hereof. In some embodiments, a first actuator 440 extends from proximal end 434b or robot unit 402 and is coupled to vise 436 to actuate vise 436. The first actuator 440 may comprise an electrically insulating material to electrically isolate proximal end 434b from vise 436.

Proximal end 434b may further comprise a second actuator 440 that is extendable from proximal end 434b to distal end 434a. As shown in FIG. 5C, when operator 124 wishes to operate robot unit 402 at the equipotential state (e.g., to operate on an energized object), actuator 440 may be extended from proximal end 434b to distal end 434a to electrically connect to vise 436, thereby electrically bonding robot unit 402 to the energized phase 426. Distal end 434a may comprise a receiver 442 proximate to vise 436 for receiving actuator 440. In some embodiments, actuator 440 comprises an end 444 that is tapered, and receiver 442 may have a corresponding taper for receiving end 444 that allows substantially all of the surface area of end 444 to be in contact with the corresponding taper in receiver 442, which may be advantageous in ensuring actuator 440 is electrically bonded to receiver 442. End 444 may take other shapes without departing from the scope hereof. For example, end 444 may be cylindrical and received within an outer cylinder formed in receiver 442. Actuators 438, 440 may be electrically actuated, hydraulically actuated, pneumatically actuated, or the like. In some embodiments, jib 404 further comprises a bracket 446 to which hydraulics 448 (e.g., a hydraulic cylinder) are mounted to power actuators 438, 440. Non-conductive hoses 449 may be coupled to hydraulics 448 to provide the clamping force for vise 436. In embodiments where actuators 438, 440 are not hydraulically actuated, bracket 446 and hydraulics 448 may be omitted, and actuators 438, 440 may be powered using electronics at robot unit 402, for example. In some embodiments, actuators 438, 440 are powered by the same power sources. In some embodiments, actuators 438, 440 are powered by separate power sources.

As shown, a first cable 450 may be electrically connected to vise 436 and extend from vise 436 to receiver 442, providing an electrical connection between vise 436 and receiver 442. A second cable 452 may be coupled to actuator 440 such that second cable 452 moves with actuator 440 as actuator 440 is extended and retracted to/from distal end 434a. Second cable 452 may be electrically conductive and electrically connected to robot unit 402 and actuator 440 (e.g., via end 444). Accordingly, when actuator 440 is received in receiver 442 and vise 436 is coupled to phases 426, current may flow from phases 426 to vise 436, from vise 436 to first cable 450, from first cable 450 to receiver 442, from receiver 442 to end 444, from end 444 to second cable 452, and from second cable 452 to robot unit 402. Thus, robot unit 402 may be at equipotential with phases 426. As such, robot unit 402 may safely operate on components of phases 426 that are energized. In some embodiments, actuator 440 is electrically conductive such that current can flow from actuator 440 to second cable 452. The flow of current through actuator 440 and/or the resultant resistance due to current flow may be monitored to detect when robot unit 402 is bonded to phase 426. For example, responsive to detecting resistance in actuator 440 or a resistance above a threshold value, robot unit 402 may be determined to be in the equipotential state. In some embodiments, actuator 440 comprises a first half and a second half wherein the two halves are electrically isolated from one another. The two halves may extend longitudinally along a length of actuator 440 and end 444 such that each of the two halves contact receiver 442 when actuator 440 is extended. Accordingly, when actuator 440 is extended and the two halves are in contact with receiver 442, a resistance between the two halves can be measured to determine that actuator 440 is in contact with receiver 442 and that a good electrical connection has been achieved. For example, a threshold resistance may be set such that the detected resistance between the two halves can be compared to the threshold resistance to determine whether actuator 440 is adequately electrically connected to receiver 442. The resistance may be monitored during operations of remote assembly system 400 to ensure the electrical connection is maintained.

In some embodiments, remote assembly system 400 is configured to detect and/or communicate a bond state (e.g., equipotential or non-equipotential) to operator 124. In some embodiments, the bond state is communicated via a user interface as discussed below with respect to FIGS. 6A and 6B. In some embodiments, the bond state is determined by monitoring the position of actuator 440 to determine a distance to receiver 442, which may be communicated to operator 124. For example, when extending actuator 440 into receiver 442, the position of actuator 440 to a final position within receiver 442 may be communicated as a percentage such that operator 124 can ascertain when the electrical bond is (or will be) established. In some embodiments, the determination of whether robot unit 402 is bonded on is based on a detection of resistance in actuator 440. For example, resistance through actuator 440 may be monitored as discussed above. Once actuator 440 establishes an electrical connection with receiver 442, resistance can be detected in actuator 440 due to the current flowing through actuator 440, thereby indicating that robot unit 402 is bonded to phase 426. As yet another example, the leakage current of jib 404 may be monitored. When robot unit 402 is not bonded and vise 436 is coupled to phase 426, jib 404 may have zero or near zero leakage current and when bonded, jib 404 may experience leakage current. Accordingly, the leakage current may be monitored and a measurement of leakage current above a threshold value may be indicative of a bond on state. As another example, end 444 may provide an indication of the bond state. For example, end 444 may visually indicate to the operator 124 when end 444 is fully engaged with receiver 442. In some embodiments, end 444 is spring-loaded with a visual indicator having a distal end (towards operator 124) that is actuated when end 444 engages with receiver 442. The distal end, which may be colored to enhance visibility, may then be viewable by the operator 124 to indicate the bonding state, and the lack of visual of the distal end may indicate to the operator 124 that remote assembly system 400 is not electrically bonded to phase 426. As another example, a momentary switch may be spring-loaded into end 444 and actuated when end 444 is engaged with receiver 442. It will be appreciated that more than one method of determining/indicating the bond state may be employed. For example, both a resistance measurement and a visual indicator may be used. As previously discussed, robot unit 402 may be restricted or prevented from performing certain actions based on whether robot unit 402 is in the equipotential state or the non-equipotential state.

Figure 5D:
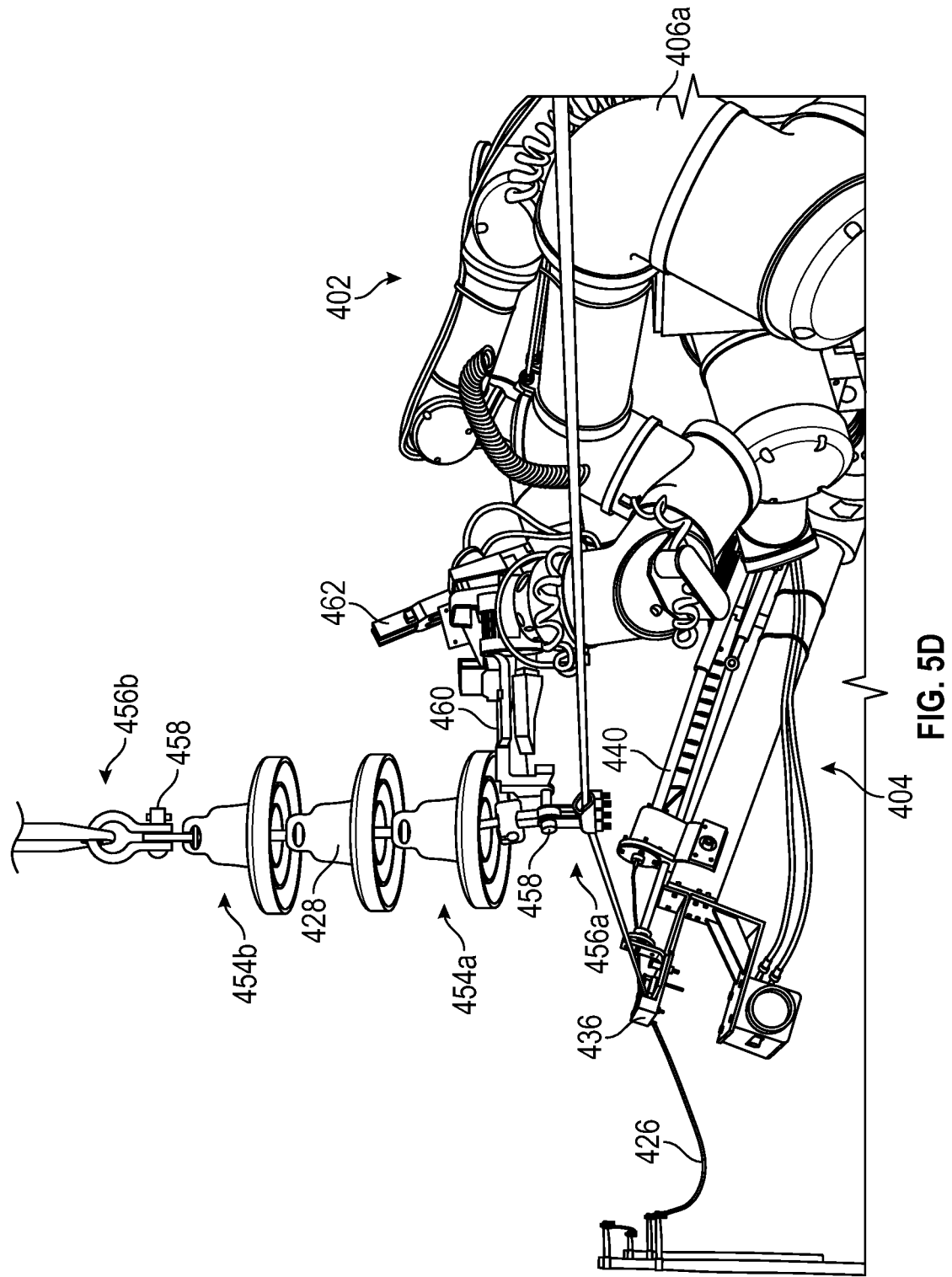
FIG. 5D-5F illustrate the remote assembly system operating on the energized power line for some embodiments.

Turning now to FIG. 5D, it can be seen that robot unit 402 has been bonded to phase 426 using actuator 440, placing robot unit 402 in the equipotential state, and operations on energized components of phases 426 may proceed. For example, robot unit 402 may operate on a phase 426 that is coupled to an insulator 428 to remove insulator 428 from the utility pole 424. As shown, a bottom portion 454a of insulator 428 may be coupled to phases 426 via a first connection 456a, while a top portion 454b of insulator 428 may be coupled to utility pole 424 (FIG. 5E) via a second connection 456b. The first connection 456a may comprise electrically conductive materials and is therefore an energized component due to the connection to phase 426. The second connection 456b meanwhile is connected to the electrically insulating insulator 428 and the grounded utility pole 424 and is therefore a deenergized component. Thus, robot unit 402 may operate on first connection 456a while in the equipotential state and on second connection 456b while in the non-equipotential state.

To remove insulator 428, robotic arms 406a, 406b may be operated by operator 124 to decouple bottom portion 454a from phases 426 when robot unit 402 is in the equipotential state. For example, one arm 406a, 406b may grasp the insulator 428 to help stabilize the insulator 428, while a second arm 406a, 406b may be operated to decouple insulator 428 from phases 426. Generally, connections 456a, 456b are pinned connections. Accordingly, decoupling insulator 428 from phases 426 may comprise arms 406a, 406b removing a pin 458 (e.g., a cotter pin) from a pin hole or the like. In some embodiments, tools holder 416 holds a pin puller tool 460 that may be operated by an arm 406a, 406b to remove a pin 458 from first connection 456a.

Figure 5E:
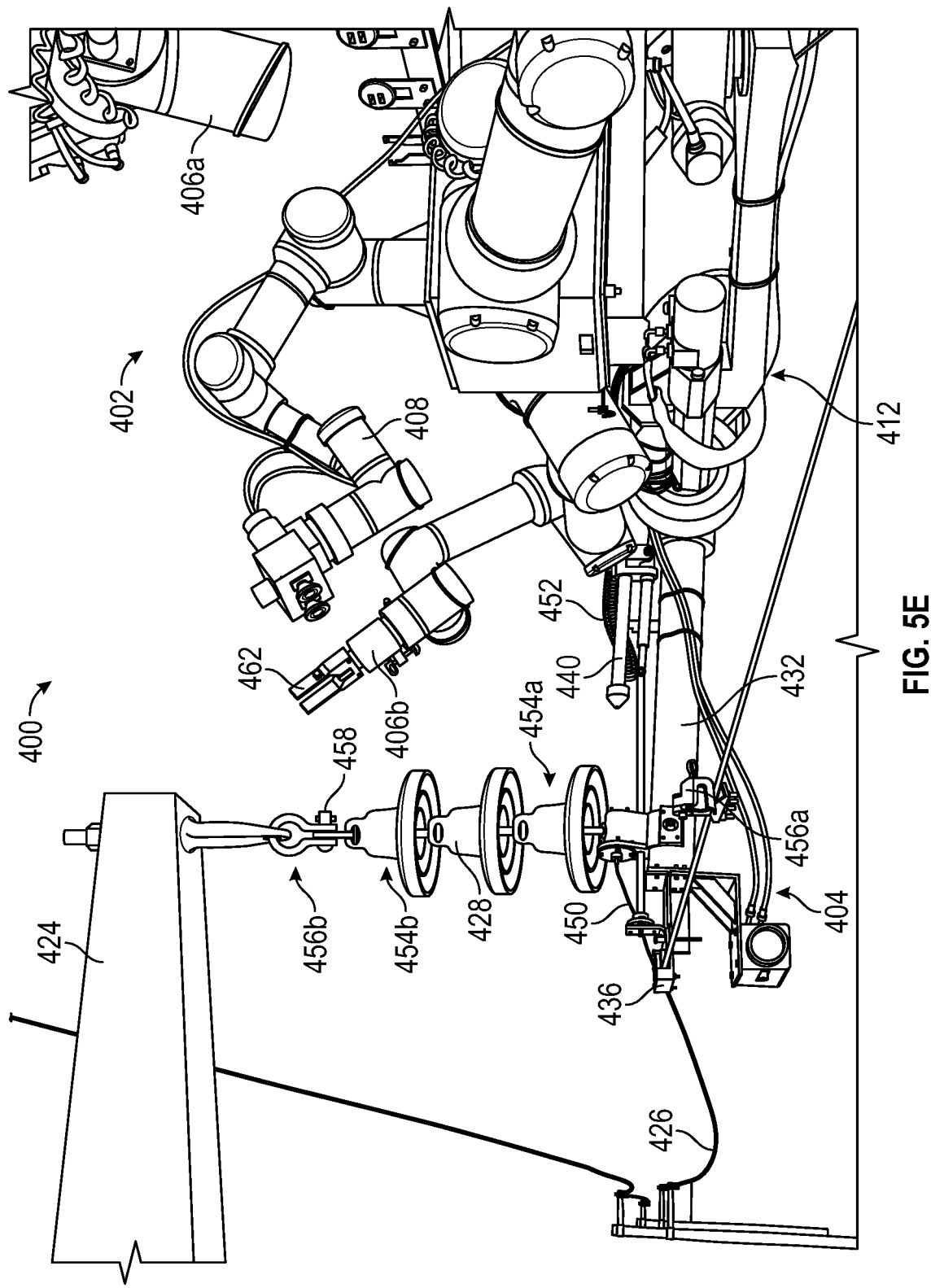

As shown in FIG. 5E, once bottom portion 454*a* is decoupled from phase 426, actuator 440 may be retracted to remove the electrical bond between actuator 440 and vise 436 to place robot unit 402 in the non-equipotential state, thereby allowing operations on second connection 456*b* to proceed. Because insulator 428 is electrically insulating, robot unit 402 may safely grasp insulator 428 without risking an earth fault despite bottom portion 454*a* no longer being at the electric potential of phases 426. However, to safely operate on second connection 456*b*, robot unit 402 may first be returned to earth or floating potential. Thus, as shown in FIG. 5E, actuator 440 may be retracted to return robot unit 402 to the non-equipotential state. In some embodiments, robotic arms 406*a*, 406*b* are removed from insulator 428 prior to retracting actuator 440. It should be noted that vise 436 may maintain the coupling with phases 426, and insulating section 432 insulates robot unit 402 while vise 436 is clamped to phases 426. Along with electrically bonding to phase 426 using vise 436, jib 404 may also move phase 426. For example, jib 404 may move phase 426 downwards and out of the way of robot unit 402 to provide robot unit 402 more room to operate on grounded components with reduced risk of contacting energized components.

Figure 5F:
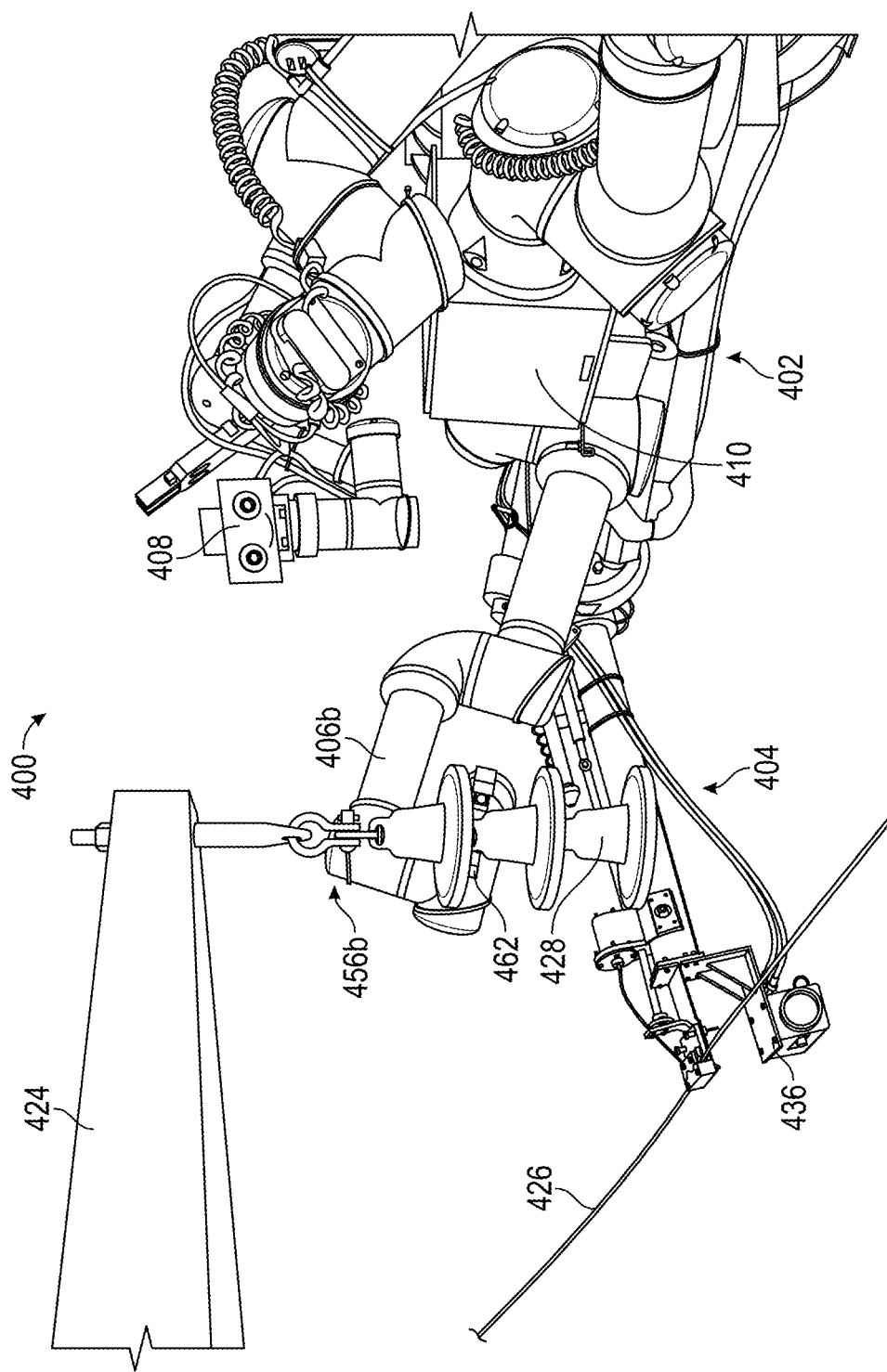

With robot unit 402 no longer bonded to phases 426 and insulator 428 decoupled from phase 426, operations on top portion 454*b* of insulator 428 to complete the removal of insulator 428 from utility pole 424 may proceed as shown in FIG. 5F where robotic arms 406*a*, 406*b* are operating on insulator 428 while robot unit 402 is in the non-equipotential state. In some embodiments, to disconnect second connection 456*b*, one arm 406*a*, 406*b* operates a grabber tool 462 for grabbing onto insulator 428 while the other arm 406*a*, 406*b* operates pin puller tool 460 to remove pin 458. Tools 460, 462 may be automatically retrievable from tools holder 416. Once first connection 456*a* is decoupled, insulator 428 may be susceptible to moving due to the wind; thus, stabilizing insulator 428 with grabber tool 462 may aid in removing second connection 456*b*. Thus, insulator 428 may be decoupled from utility pole 424 and a new insulator 428 may be installed. When insulator 428 is decoupled from both connections 456*a*, 456*b*, arms 406*a*, 406*b* may automatically place the removed insulator 428 in receptacle 420.

It is contemplated that installation of a new insulator 428 may occur similarly to removal of insulator 428. Arms 406*a*, 406*b* may be configured to automatically retrieve a new insulator 428 from parts holder 418. Specifically, installation of a new insulator 428 may proceed as follows: (1) top portion 454*b* is coupled to utility pole 424 via second connection 456*b* while robot unit 402 is at earth or floating potential (i.e., with actuator 440 retracted); (2) actuator 440 is extended to place robot unit 402 at the equipotential state with phase 426; and (3) while in the equipotential state, robotic arms 406*a*, 406*b* are used to couple bottom portion 454*a* to phases 426 via first connection 456*a*. As with removal of an insulator 428, vise 436 may remain coupled to phase 426 during the entire process of installing insulator 428.

Figure 6A:
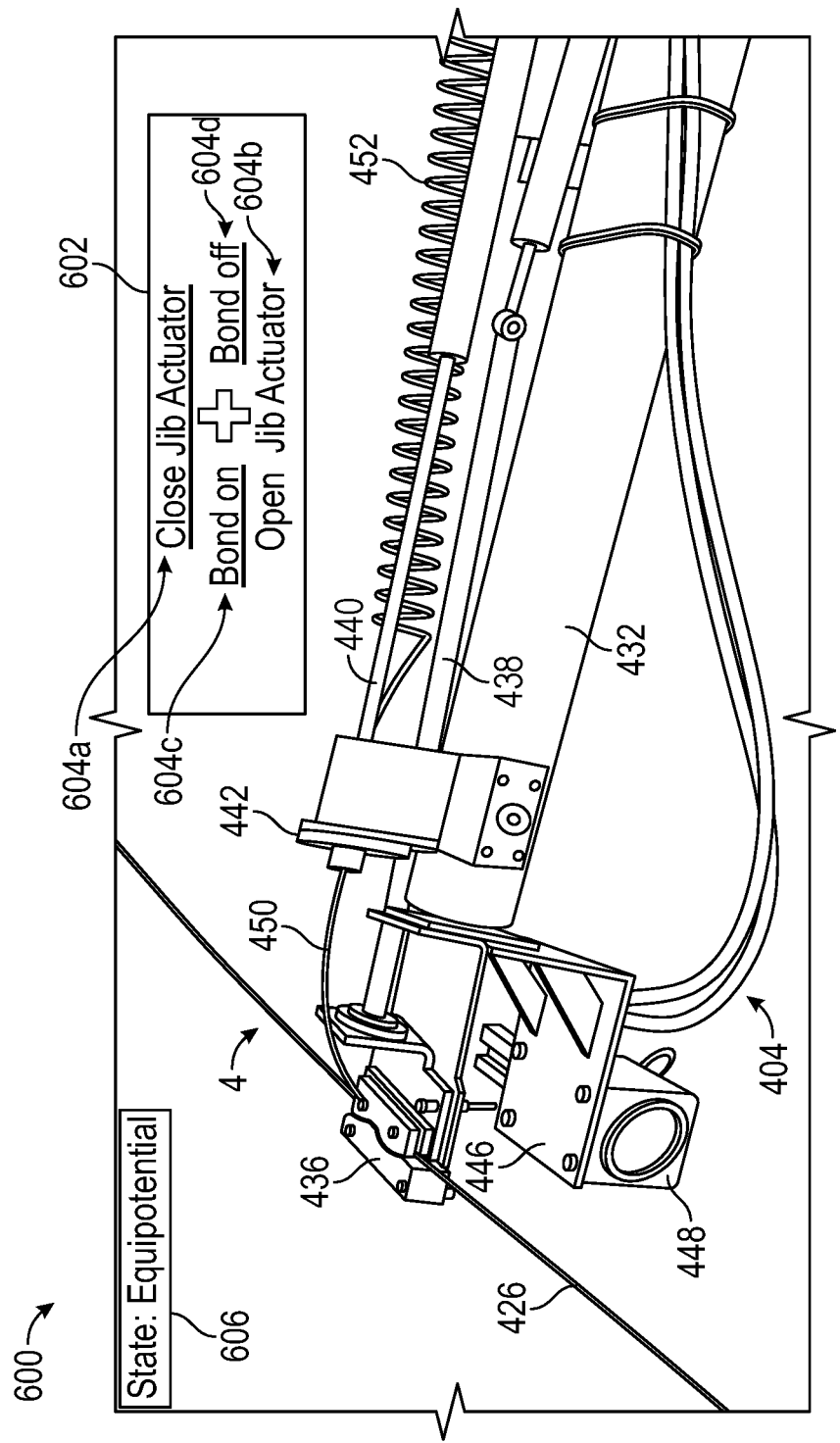
FIGS. 6A-6B illustrate a user interface for some embodiments.

Turning now to FIG. 6A, a user interface 600 is illustrated in accordance with embodiments of the present disclosure. The user interface 600 may comprise one or more user interface elements overlaid the image of the remote location as captured by camera mount 408. In some embodiments, user interface 600 comprises various screens or pages 602 that operator 124 can toggle between to access different controls for operating robot unit 402. As shown, the currently displayed page 602 comprises four affordances 604*a*, 604*b*, 604*c*, 604*d* that may be selectable by operator 124 to cause jib 404 to perform a corresponding action. In some embodiments, responsive to selection of the affordance, arms 406*a*, 406*b* are prevented from carrying out other actions until jib 404 completes the selected action. In some embodiments, arms 406*a*, 406*b* may operate independently of jib 404, and may continue to perform work while jib 404 performs the selected action.

In some embodiments, a first affordance 604*a* is selectable to cause jib 404 to close vise 436. Vise 436 may be closed to couple jib 404 to phase 426 as previously discussed. Correspondingly, a second affordance 604*b* may be selectable to cause jib to open vise 436. A third affordance 604*c* may be selected to initiate a bond on action, which may comprise extending actuator 440 to insert end 444 into receiver 442 as previously discussed. A fourth affordance 604*d* may be provided to initiate a bond off action, which may comprise retracting actuator 440 from end 444 to place robot unit 402 in a non-equipotential state. Each action initiated by selection of a corresponding affordance 604*a*, 604*b*, 604*c*, 604*d* may be automatically performed by remote assembly system 400, i.e., without requiring any further input from operator 124. In some embodiments, the operation of coupling vise 436 to phase phases 426 is entirely automatic. For example, computer vision techniques may be used to identify phase 426 (e.g., using imagery captured by cameras on camera mount 408) and jib 404 may be automatically positioned in the correct location where phase 426 is within vise 436 whereupon vise 436 may be closed.

User interface 600 may further comprise an indicator 606. The indicator 606 may be a textual and/or graphical display indicating a state of robot unit 402, the current action being performed, a progress of the current action, or the like. For example, while actuator 440 is extending towards receiver 442, indicator 606 may read "bonding on-75%" when actuator 440 is 75% of the way towards the final position within receiver 442.

Indicator 606 may also comprise sensor readings relating to operations of remote assembly system 400. For example, indicator 606 may display sensor data associated with operation of jib 404 or other components on robot unit 402. For example, the sensor readings may display current readings from a sensor (e.g., sensor 220) on jib 404 and/or boom assembly 114 that is configured to detect leakage current across insulating section 432 or boom assembly 114. If the leakage current exceeds a threshold, a warning may be displayed to operator 124 via user interface 600 and/or other preventative action may be taken (e.g., automatically decoupling vise 436 from phase 426.

Figure 6B:
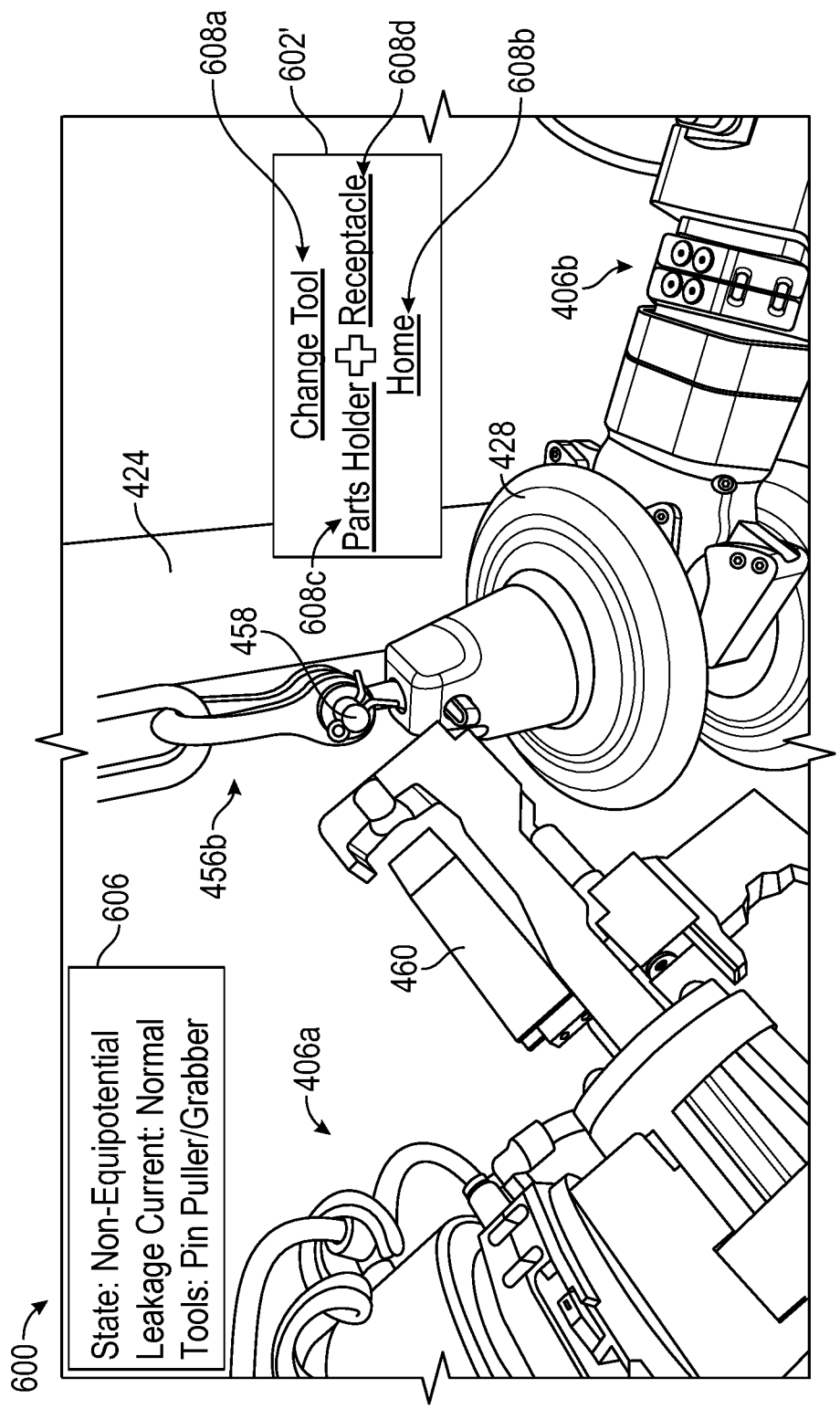

Turning now to FIG. 6B, a user interface 600 is illustrated in accordance with embodiments of the present disclosure. As shown, user interface 600 may change during operation of user interface 600, e.g., based on the operation being performed, in response to user input, etc. In some embodiments, the page 602 changes based on the current object being looked at. For example, if it is detected that camera mount 408 is looking at jib 404, page 602 may be displayed to provide the operator 124 with controls for controlling the operations for jib 404. Pages 602 may also be switched between manually by operator 124. A new page 602' is shown, displaying a different set of affordances than available in page 602. For example, page 602' may include affordances associated with operating on second connection 456*b*.

A first affordance 608*a* may be selectable to initiate a change tool action. Selection of first affordance 608*a* may cause one or more arms 406a, 406b to automatically change a tool or to retrieve a tool from tools holder 416 if no tools are currently equipped. For example, when operator 124 wishes to remove a connection 456a, 456b, operator 124 may select first affordance 608a to automatically retrieve the pin puller tool 460 to remove the pin 458. In some embodiments, selection of first affordance 608a brings up an additional page (not shown) comprising a list of tools in tools holder 416 that operator 124 may select from to retrieve the selected tool using arms 406a, 406b. In some embodiments, operator 124 can select a tool via voice command or by using other methods, such as gaze tracking.

A second affordance 608b may be actuatable to return robot unit 402 to a home position. The home position for robot unit 402 may be predefined or an operator may define a home position or robot unit 402. In some embodiments, the home position is a predefined distance/position from the power distribution line 425.

A third affordance 608c may be configured to retrieve a part from parts holder 418. For example, after decoupling insulator 428 from phase 426 and utility pole 424, third affordance 608c may be selected to automatically retrieve a new insulator held in parts holder 418 for installing the new conductor onto the utility pole 424. A fourth affordance 608d may be configured to place a part in receptacle 420. Placing a part in receptacle 420 with arms 406a, 406b may be an automated task.

Figure 7:
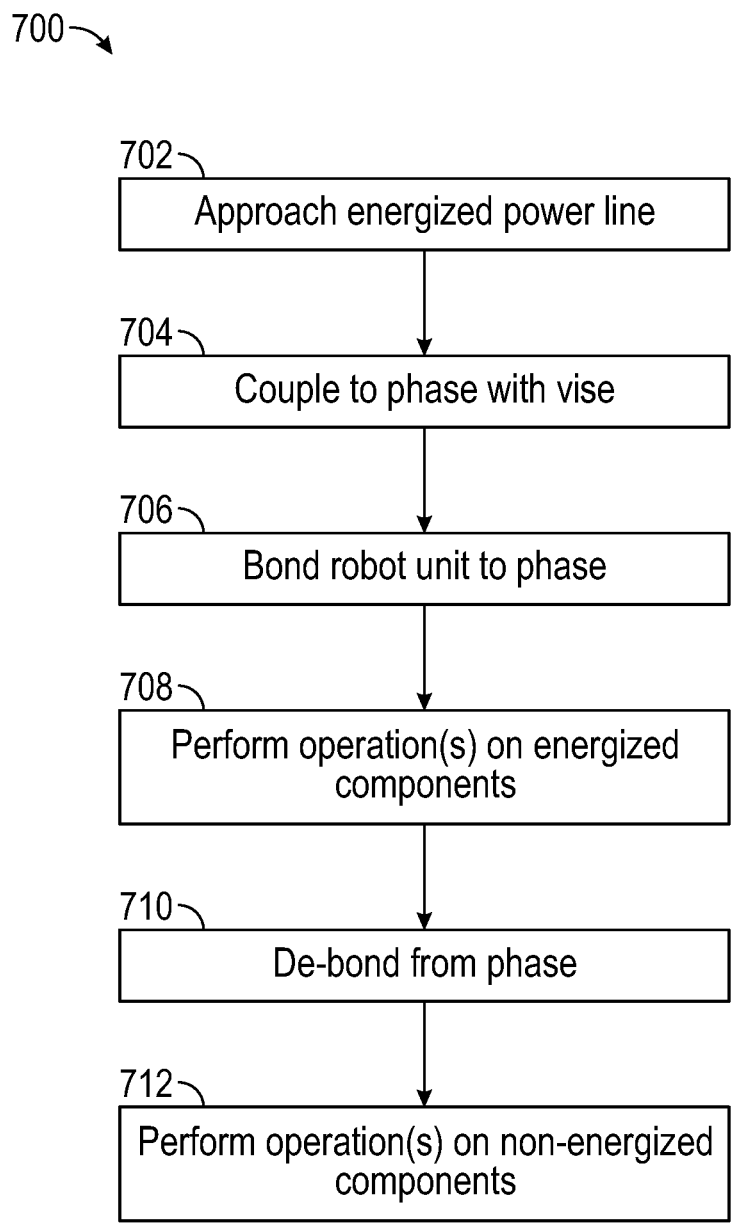
FIG. 7 illustrates a method in accordance with embodiments of the present disclosure.

FIG. 7 illustrates an exemplary method 700 for remotely operating on an energized power line in accordance with embodiments of the present disclosure. Method 700 may enable safe operation on energized power lines where the physical distance between energized and grounded components is close enough such that simultaneous contact with an energized component and a ground component is a risk. Method 700 is discussed with respect to performing maintenance on an insulator 428, but it will be appreciated that other maintenance tasks are in accordance with the scope of the present disclosure.

Method 700 may begin at step 702, where a remote assembly, such as remote assembly system 400, approaches a remote location, such as power distribution lines 425. The energized power line may be a distribution type power line, a transmission type power line, or any other type of power line. When remote assembly system 400 approaches the energized power line, remote assembly system 400 is at the non-equipotential state, i.e., at earth or floating potential.

Next, at step 704, jib 404 may be coupled to phase 426 using vise 436. Step 704 may occur while actuator 440 is retracted and not in contact with receiver 442. Accordingly, distal end 434a is electrically bonded to phase 426, while insulating section 432 electrically isolates proximal end 434b and robot unit 402 from phases 426 such that robot unit 402 remains in the non-equipotential state. While in the non-equipotential state, robot unit 402 may operate on components that are at earth potential.

Next, at step 706, robot unit 402 may be electrically bonded to phases 426 to place robot unit 402 in the equipotential state. Electrically bonding robot unit 402 to phases 426 may comprise electrically coupling actuator 440 to vise 436 by inserting actuator 440 into receiver 442 as previously discussed. It will be appreciated that other methods of electrically bonding proximal end 434b to distal end 434a are within the scope hereof. Further, as previously discussed, various methods to determine when robot unit 402 is/is not electrically bonded to phases 426 may be used in accordance with aspects of the present disclosure. The bonding state of robot unit 402 may be communicated to operator 124 using user interface 600 and/or auditorily or via any other method.

At step 708, robot unit 402 may operate on energized components of the power line. For example, as discussed above, the operations may involve decoupling the insulator 428 from the energized phase 426. As another example, work may be performed directly on the phase 426, such as to remove or add a wire tie to the phase 426. Operations directly on a phase 426 may be assisted by jib 404 moving the phase 426 to a desired work position for operator 124 to work on the phase. For example, the jib 404 may hold the phase 426 below robot unit 402 and out of the way of robot unit 402 while robot unit 402 operates on insulator 428 and may raise the phase 426 up to a level of robot unit 402 for robot unit 402 to work on the phase 426. While robot unit 402 is performing operations on energized power line components, a minimum distance between remote assembly system 400 and grounded components may be maintained to prevent line-to-line or line-to-ground faults.

Next, at step 710, when it is desired for remote assembly system 400 to operate on grounded components, robot unit 402 may be de-bonded from the phase 426 to place robot unit 402 back in the non-equipotential state. The de-bonding may comprise retracting actuator 440 from receiver 442 and removing the electrical bond between actuator 440 and vise 436. The vise 436 may maintain the coupling with the phase phases 426 to hold phase 426 substantially stationary while insulating section 432 maintains electrical isolation for robot unit 402. As with bonding on to phases 426, the de-bonding process may be communicated to operator 124 via user interface 600, via audio communications, or any other communication method.

At step 712, operations may be performed on components that are at earth potential. For example, phases 426 may be decoupled from the utility pole via second connection 456b that is at earth potential. As with operating in the equipotential state and maintaining a minimum distance between robot unit 402 and grounded components, a minimum distance may be maintained between robot unit 402 and energized components when operating at the non-equipotential state.

It will be appreciated that the ordering of steps in method 700 is for example purposes only, and that steps may occur in a different order than shown in method 700. For example, when installing a new insulator 428, robot unit 402 may first couple the new insulator 428 to utility pole 424 via second connection 456b while operating in the non-equipotential state, and subsequently electrically bond to the energized phases 426 for coupling the new insulator 428 to phases 426 via first connection 456a.

Although the present teachings have been described with reference to the embodiments illustrated in the attached drawing figures, it is noted that equivalents may be employed, and substitutions made herein without departing from the scope of the present teachings as recited in the claims.

Having thus described various embodiments, what is claimed as new and desired to be protected by Letters Patent includes the following:

1. A system for remotely operating on energized power lines, comprising:
    a boom assembly having a boom proximal end and a boom distal end; and
    a remote assembly coupled to the boom distal end, the remote assembly comprising:
        a robot unit for operating on an energized power line; and a jib coupled to the robot unit and configured to electrically bond to a phase of the energized power line, the jib comprising:
  a jib distal end;
  a jib proximal end coupled to the robot unit;
  an electrically insulating section between the jib distal end and the jib proximal end;
  an end effector at the jib distal end for coupling to the phase, the end effector comprising a first cable;
  a tapered receiver electrically connected to the first cable; and
  an actuator at the jib proximal end and movable from the jib proximal end to the jib distal end for electrically connecting to the end effector to electrically bond the robot unit to the phase, comprising:
    a tapered end; and
    a second cable that electrically connects to the first cable when the tapered end of the actuator is received in the tapered receiver to electrically bond the robot unit to the energized power line.

2. The system of claim 1, further comprising:
  a plurality of tools stored at the remote assembly,
  wherein a first tool of the plurality of tools is a pin puller tool for decoupling a first end of an insulator from the phase, and
  wherein the robot unit further comprises at least one robotic arm configured to operate the pin puller tool.

3. The system of claim 2, further comprising one or more non-transitory media storing computer-executable instructions that, when executed by at least one processor, cause the robot unit to:
  decouple the insulator from the phase while the robot unit is electrically bonded to the energized power line.

4. The system of claim 2, further comprising one or more non-transitory media storing computer-executable instructions that, when executed by at least one processor, cause the robot unit to:
  decouple a second end of the insulator from a utility pole of the energized power line while the remote assembly is not electrically bonded to the energized power line.

5. The system of claim 1, further comprising:
  a user interface configured to display a bonding state of the robot unit.

6. The system of claim 5, wherein the user interface comprises at least one affordance actuatable to generate a control signal to the robot unit to perform one of a bond off action or a bond on action.

7. The system of claim 1, wherein the jib further comprises:
  hydraulics for powering the actuator; and
  a bracket supporting the hydraulics.

8. The system of claim 5, further comprising:
  at least one camera located at the remote assembly; and
  one or more non-transitory media storing computer-executable instructions that when executed by at least one processor, carry out actions comprising:
    receive image data from the at least one camera;
    detect an object in the image data; and
    update the user interface based on the object detected in the image data.

9. The system of claim 1, further comprising a sensor configured to monitor a leakage current of the jib.

10. The system of claim 1, wherein the end effector comprises a vise, a spring-loaded latch, a two-finger clamp, or a crow's hook.

\* \* \* \* \*

UNITED STATES PATENT AND TRADEMARK OFFICE
CERTIFICATE OF CORRECTION

| | | |
|---|---|---|
| PATENT NO. | : 12,199,414 B1 | Page 1 of 1 |
| APPLICATION NO. | : 18/396009 | |
| DATED | : January 14, 2025 | |
| INVENTOR(S) | : William Naber, Robert Nichols and Timothy J. Mourlam | |

It is certified that error appears in the above-identified patent and that said Letters Patent is hereby corrected as shown below:

On the Title Page

Item (73) should read as follows:
Altec Industries, Inc., Birmingham, AL (US)

Signed and Sealed this
Twenty-fifth Day of February, 2025

Coke Morgan Stewart
*Acting Director of the United States Patent and Trademark Office*